US012696768B2

(12) United States Patent
Chuang et al.

(10) Patent No.: US 12,696,768 B2
(45) Date of Patent: Jul. 28, 2026

(54) WAFER BONDING METHOD AND BONDED DEVICE STRUCTURE

(71) Applicant: Taiwan Semiconductor Manufacturing Co., Ltd., Hsinchu (TW)

(72) Inventors: Harry-Haklay Chuang, Zhubei City (TW); Yuan-Jen Lee, Hsinchu (TW); Fang-Lan Chu, Taichung City (TW); Wei Cheng Wu, Zhubei City (TW); Nuo Xu, San Jose, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 1050 days.

(21) Appl. No.: 17/748,547

(22) Filed: May 19, 2022

(65) Prior Publication Data

US 2023/0299041 A1 Sep. 21, 2023

Related U.S. Application Data

(60) Provisional application No. 63/321,213, filed on Mar. 18, 2022.

(51) Int. Cl.
*H10W 46/00* (2026.01)
*H10W 72/90* (2026.01)
(Continued)

(52) U.S. Cl.
CPC .......... *H10W 46/00* (2026.01); *H10W 46/301* (2026.01); *H10W 72/985* (2026.01); (Continued)

(58) Field of Classification Search
CPC ...... H01L 24/80; H01L 24/07; H10W 46/301; H10W 46/00; H10W 80/312; H10W 80/163; H10W 72/985; H10W 90/792
See application file for complete search history.

(56) References Cited

U.S. PATENT DOCUMENTS 8,355,139 B2   1/2013   Shim
9,012,265 B2   4/2015   Yi et al.
(Continued)

FOREIGN PATENT DOCUMENTS

CN        104282607 A    1/2015
CN        104282608 A    1/2015
(Continued)

*Primary Examiner* — Eric K Ashbahian
(74) *Attorney, Agent, or Firm* — Slater Matsil, LLP

(57) ABSTRACT

In an embodiment, a structure includes: a first device including a first dielectric layer and a first alignment mark in the first dielectric layer, the first alignment mark including a first magnetic cross, the first magnetic cross having a first north pole and a first south pole; and a second device including a second dielectric layer and a second alignment mark in the second dielectric layer, the second alignment mark including a second magnetic cross, the second magnetic cross having a second north pole and a second south pole, the first north pole aligned with the second south pole, the first south pole aligned with the second north pole, the first dielectric layer bonded to the second dielectric layer by dielectric-to-dielectric bonds, the first alignment mark bonded to the second alignment mark by metal-to-metal bonds.

20 Claims, 24 Drawing Sheets

(51) Int. Cl.
  *H10W 80/00*          (2026.01)
  *H10W 90/00*          (2026.01)
(52) U.S. Cl.
  CPC ........ *H10W 80/163* (2026.01); *H10W 80/312*
    (2026.01); *H10W 80/327* (2026.01); *H10W*
    *90/792* (2026.01)

(56)                References Cited

U.S. PATENT DOCUMENTS

| | | | | |
|---|---|---|---|---|
| 9,070,729 | B2 | 6/2015 | Ji et al. | |
| 9,548,290 | B2 * | 1/2017 | Wakiyama | H10F 39/199 |
| 2013/0252375 | A1 | 9/2013 | Yi et al. | |
| 2015/0093880 | A1 | 4/2015 | Ji et al. | |
| 2016/0093601 | A1 * | 3/2016 | Ding | H01L 23/544 |
| | | | | 257/777 |

| | | | | |
|---|---|---|---|---|
| 2018/0033773 | A1 * | 2/2018 | Huang | H10W 90/00 |
| 2022/0221803 | A1 * | 7/2022 | Ha | H01L 23/544 |
| 2022/0223483 | A1 | 7/2022 | Chaji | |
| 2023/0017933 | A1 * | 1/2023 | Han | C23C 14/042 |
| 2023/0299010 | A1 * | 9/2023 | Chuang | H01L 23/544 |
| | | | | 257/30 |

FOREIGN PATENT DOCUMENTS

| | | |
|---|---|---|
| CN | 110429074 A | 11/2019 |
| CN | 113826165 A | 12/2021 |
| KR | 20050069938 A | 7/2005 |
| KR | 20150037146 A | 4/2015 |
| KR | 101573463 B1 | 12/2015 |
| KR | 20190054039 A | 5/2019 |
| TW | 202111721 A | 3/2021 |
| WO | 2005122706 A2 | 12/2005 |
| WO | 2021179270 A1 | 9/2021 |

* cited by examiner

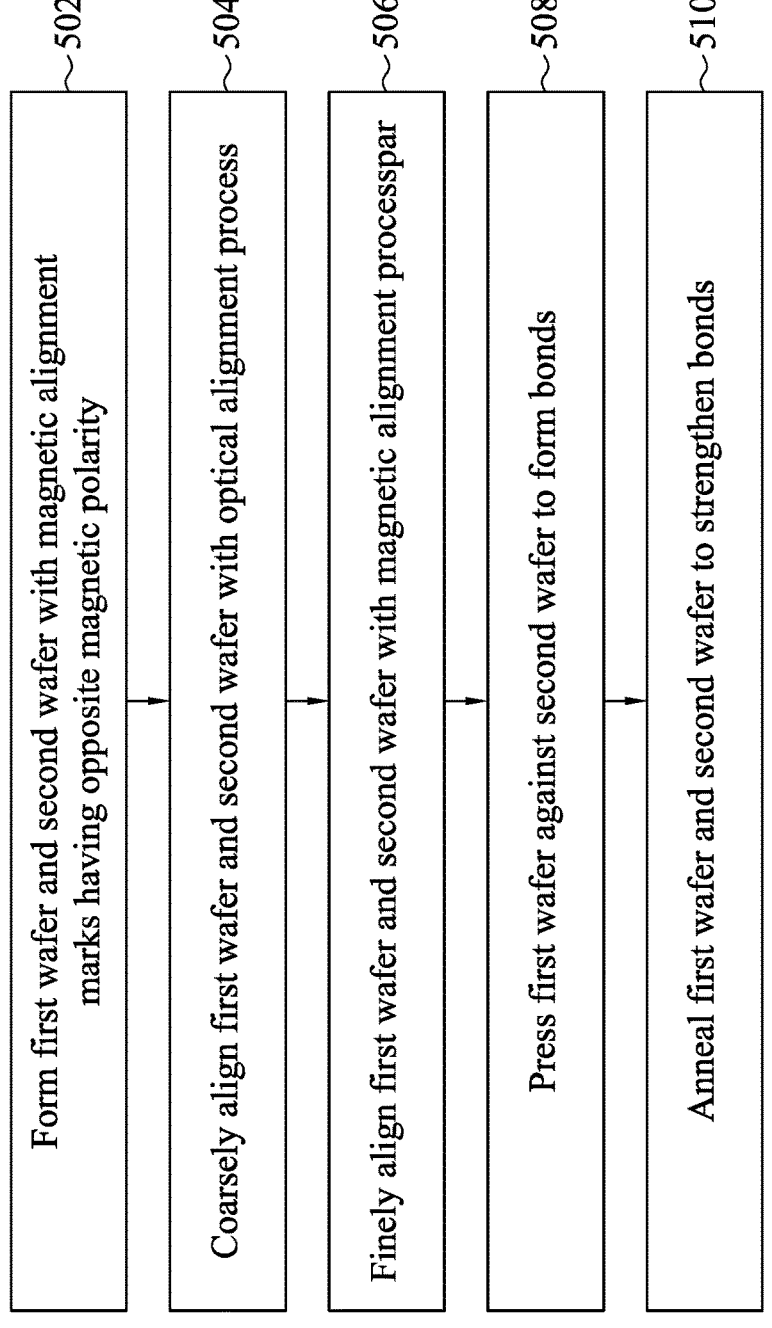

502 ~ Form first wafer and second wafer with magnetic alignment marks having opposite magnetic polarity 504 ~ Coarsely align first wafer and second wafer with optical alignment process 506 ~ Finely align first wafer and second wafer with magnetic alignment processpar 508 ~ Press first wafer against second wafer to form bonds 510 ~ Anneal first wafer and second wafer to strengthen bonds

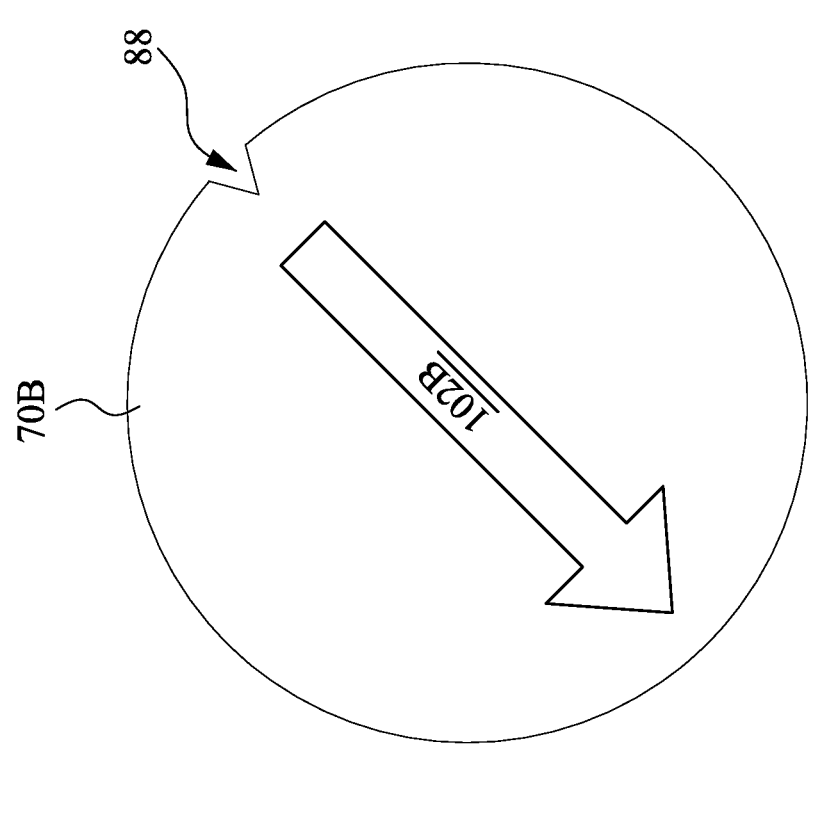
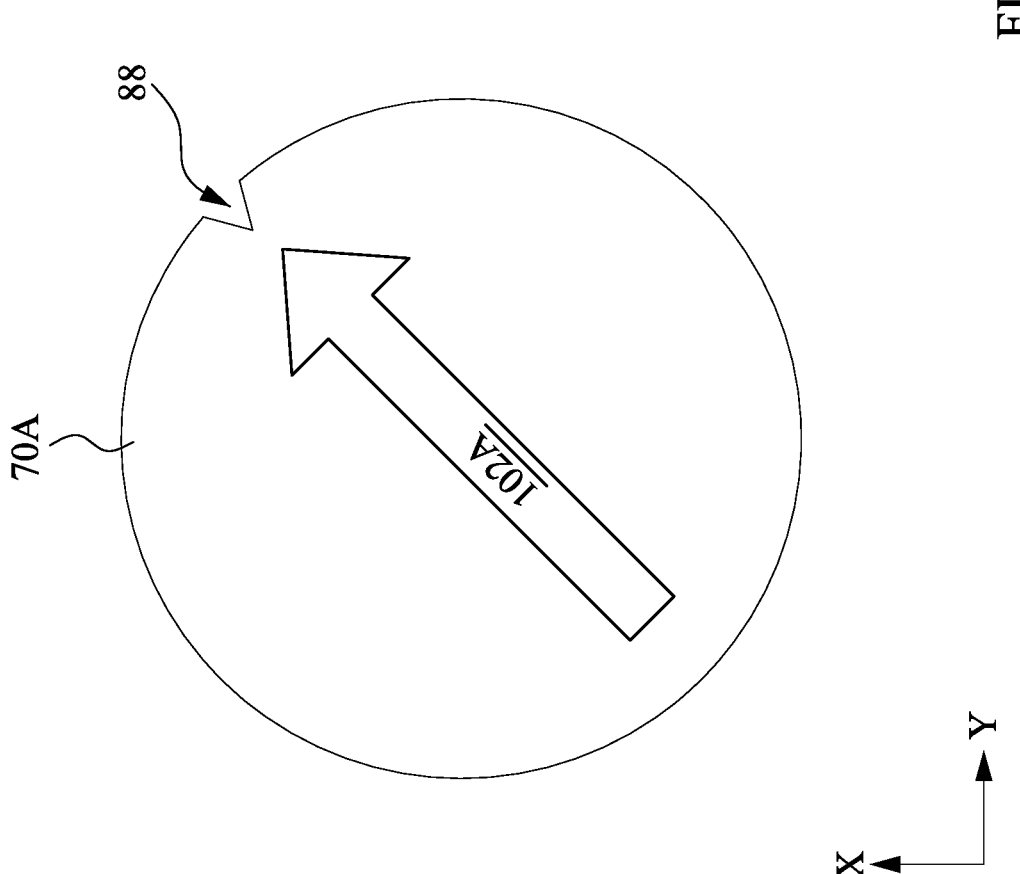
FIG. 6

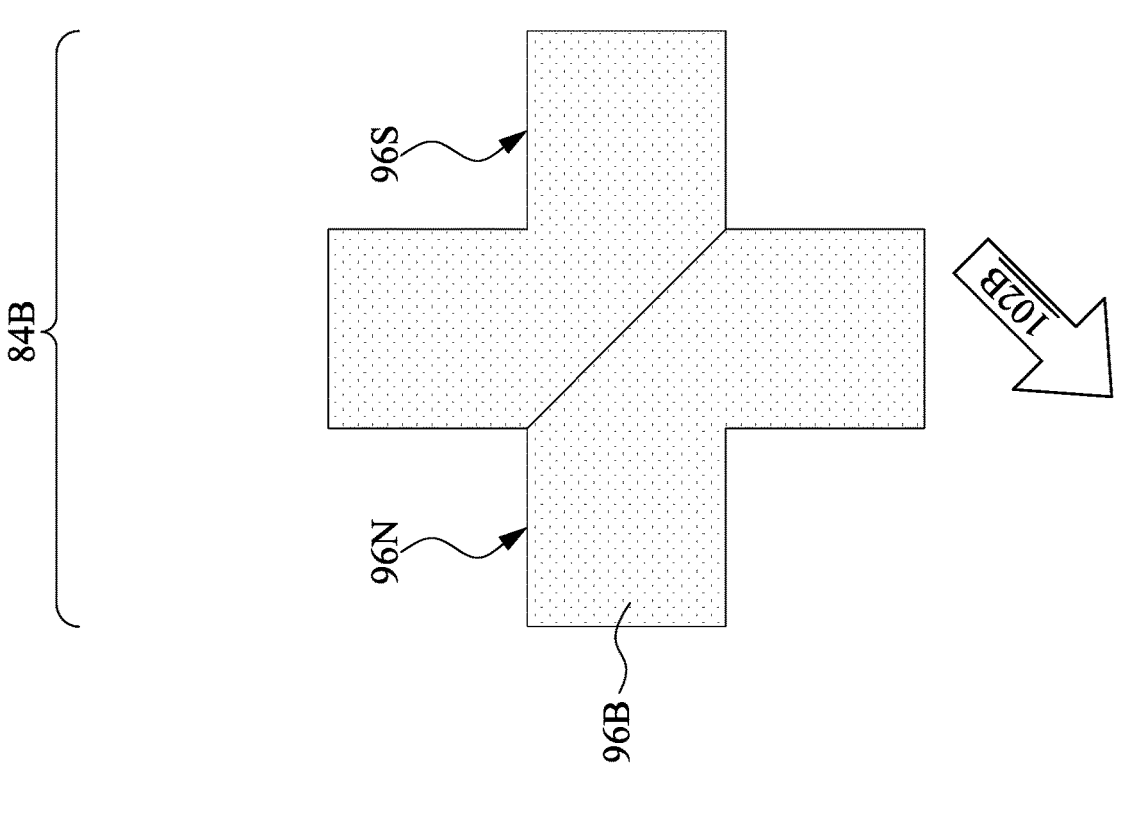
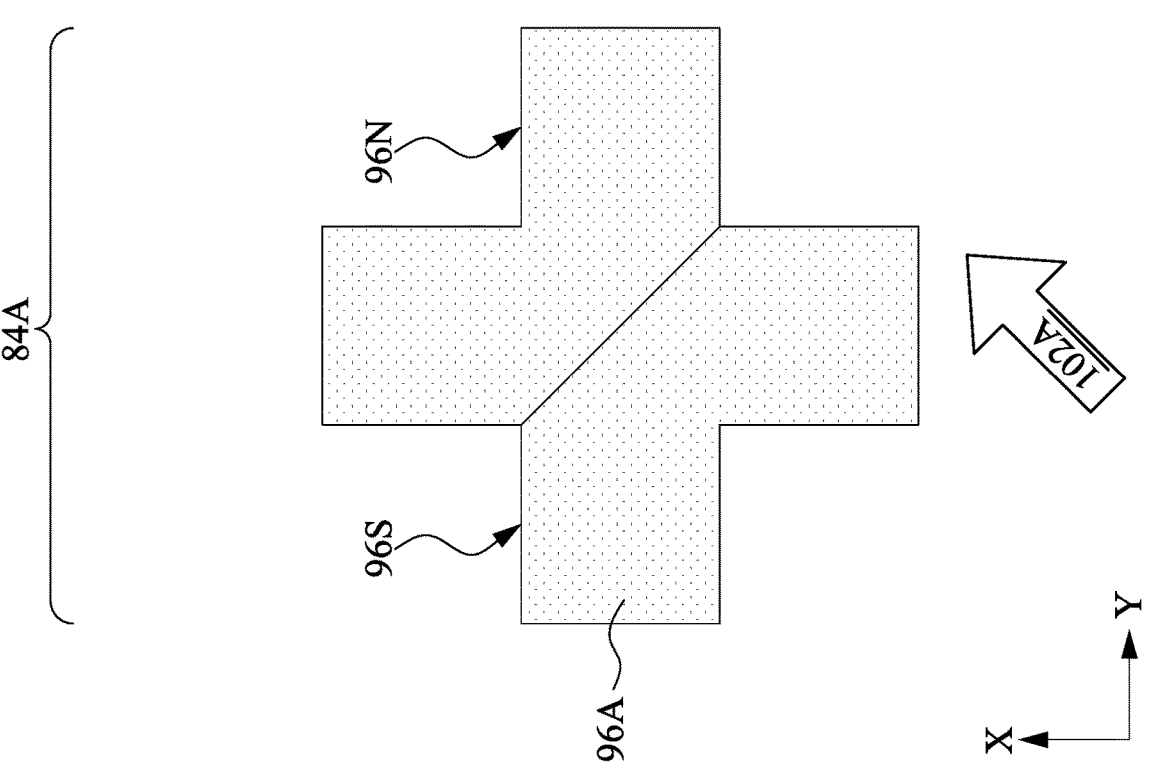
FIG. 7

108

106B

84B

70A

106A

70B

84A

104B

104A $G_1$

108

106B

84B

70B

70A

84A

106A

104B

104A

G$_2$

108

106B

84B

106A

70A

84A

70B

104B

104A

X/Y

Z

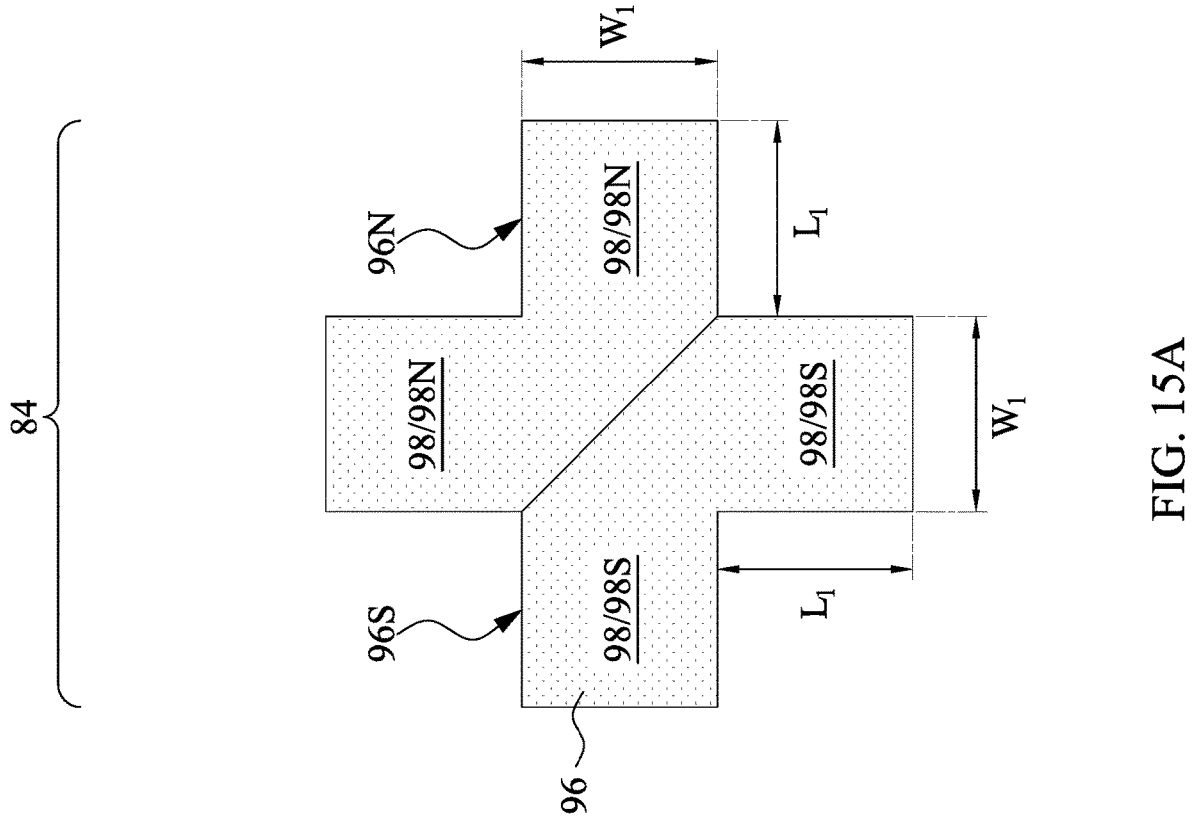
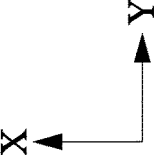
FIG. 15A

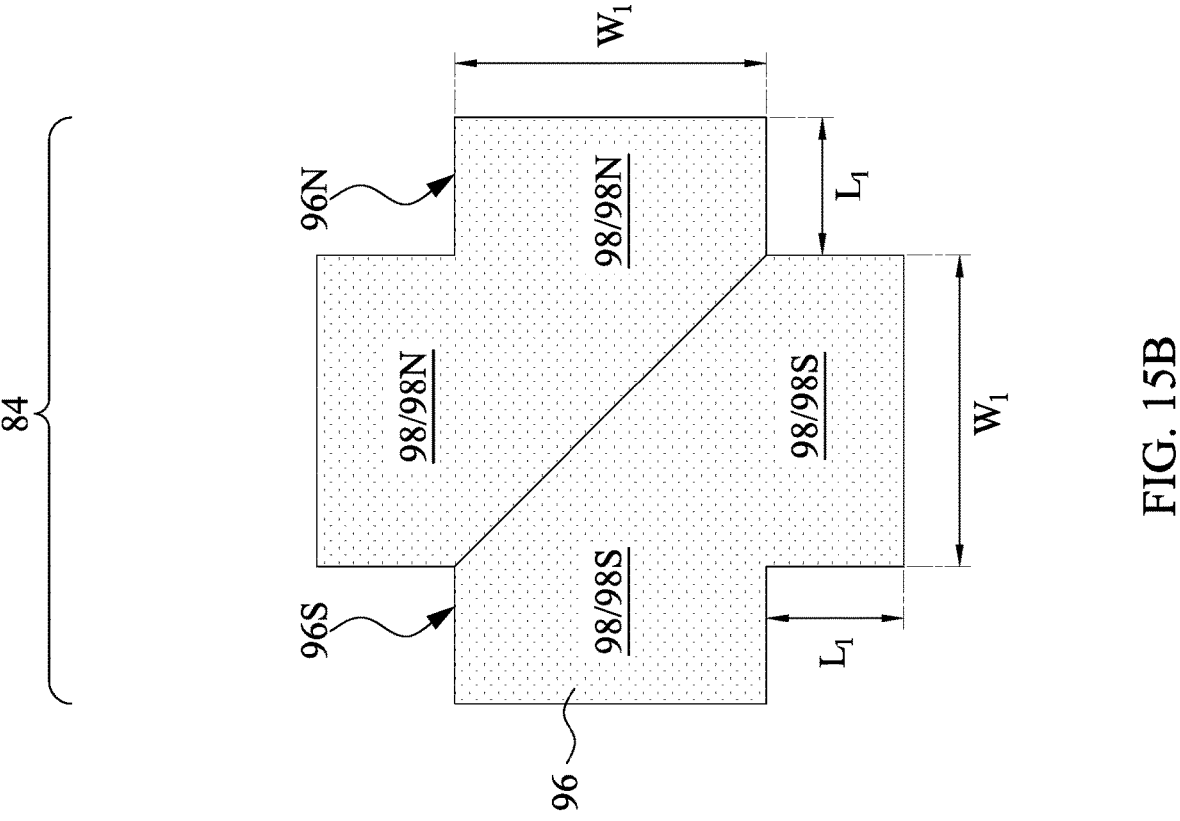
FIG. 15B
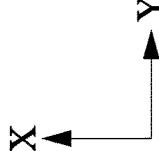

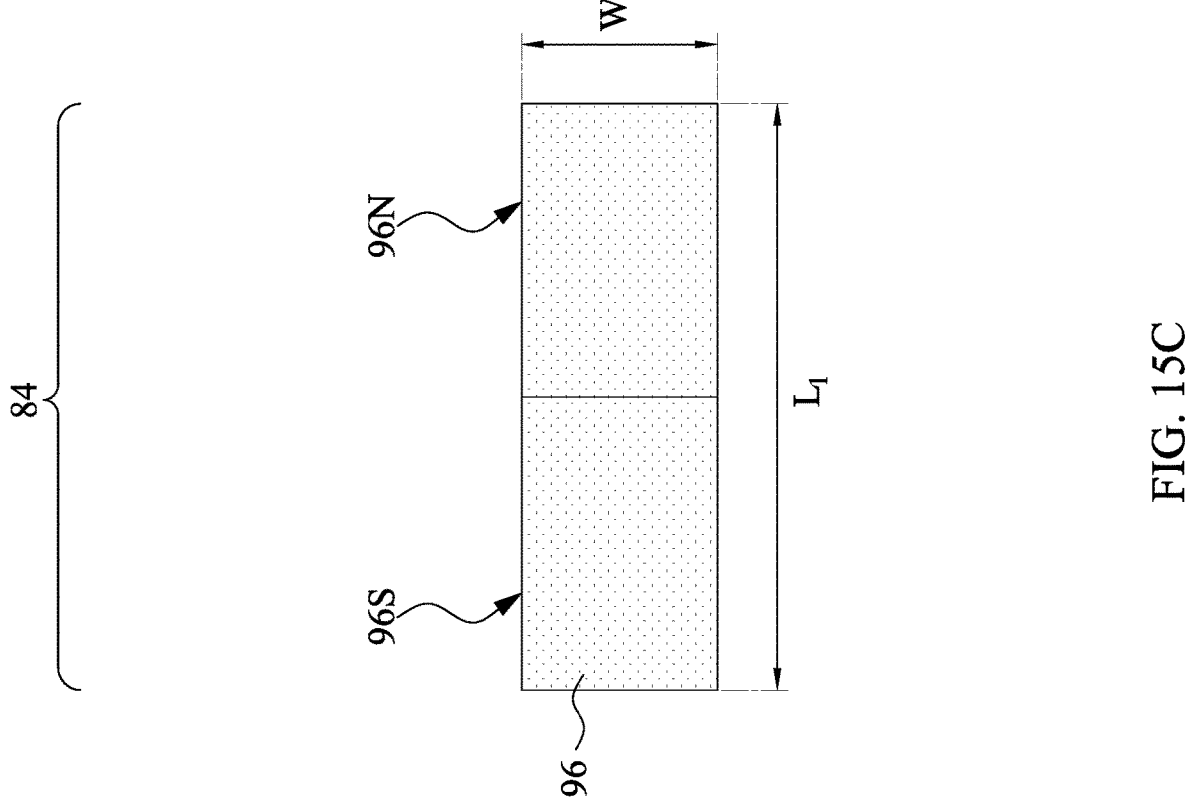
FIG. 15C
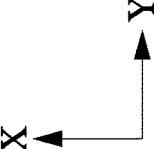

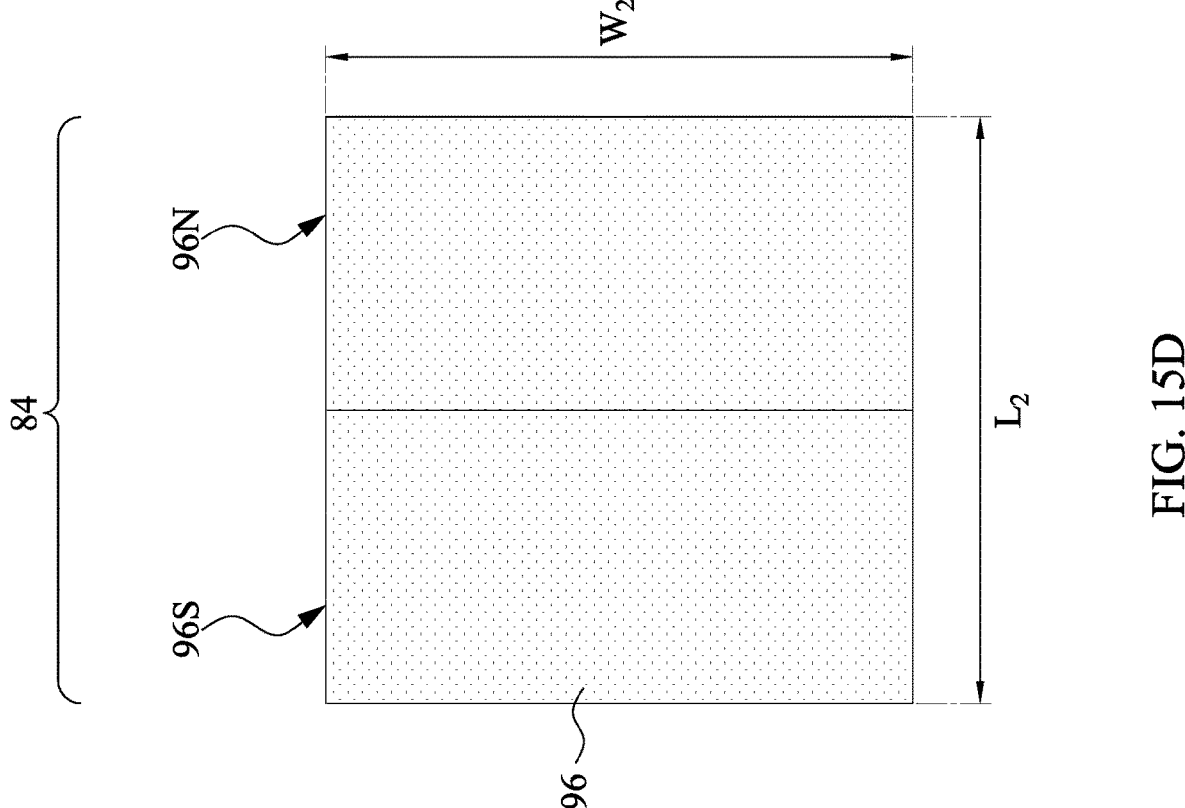
FIG. 15D
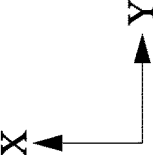

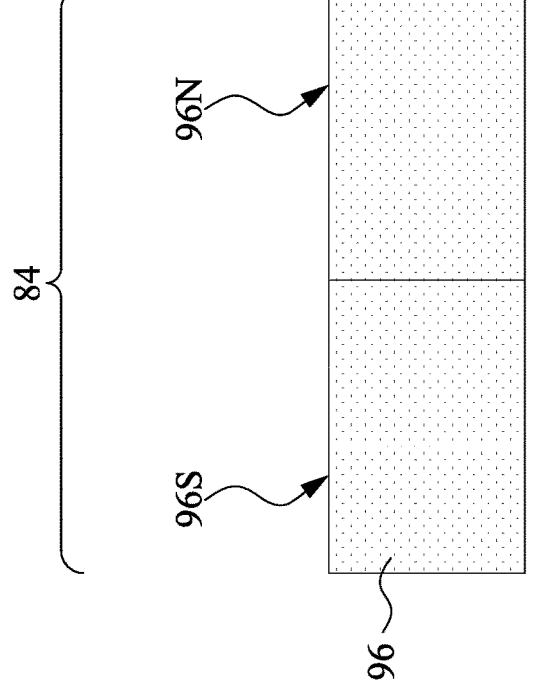
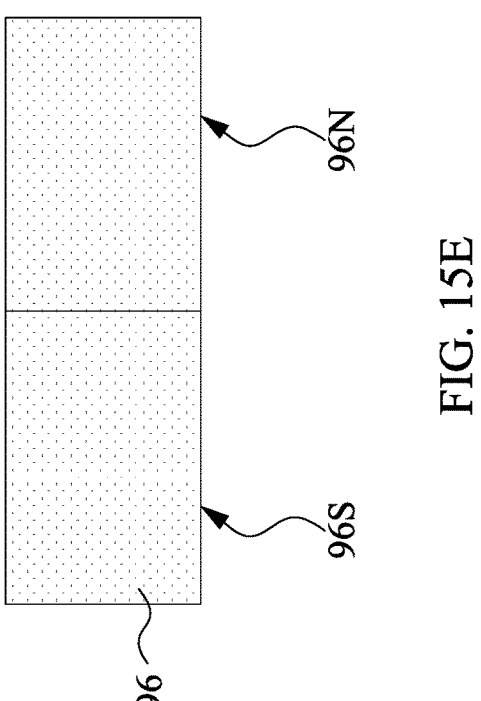
FIG. 15E
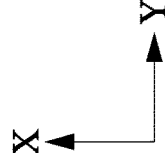

96N

96S

96

84

96

96N

96S

96

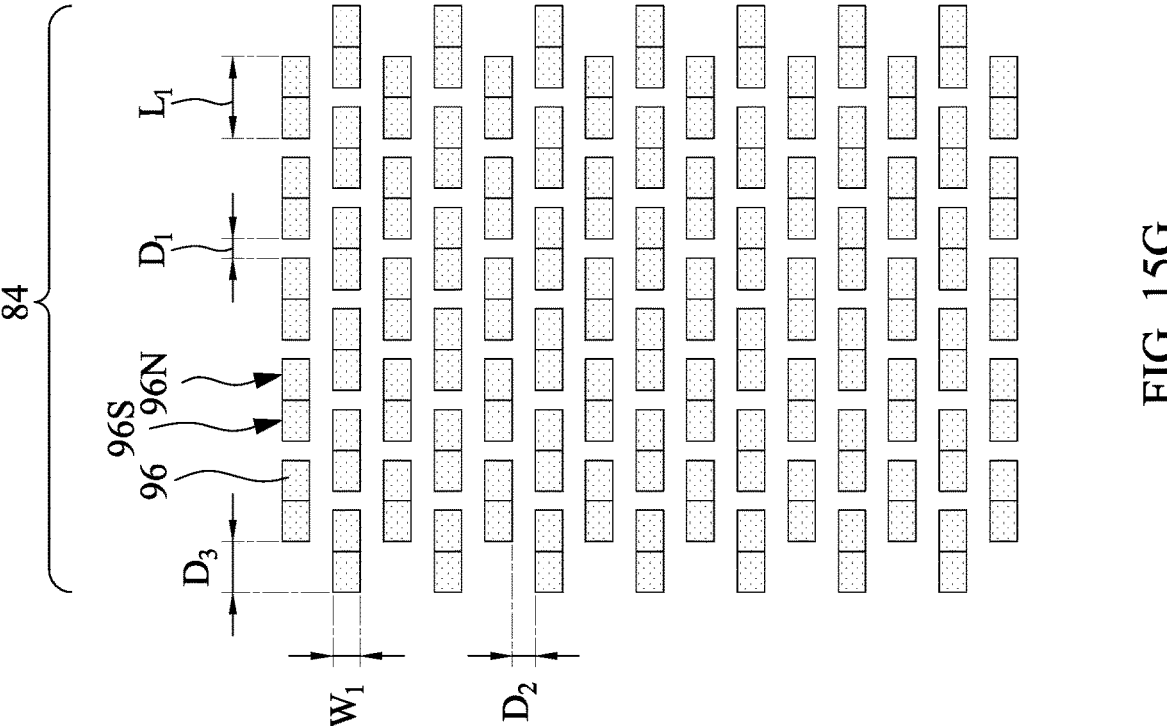
FIG. 15G
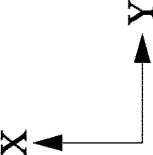

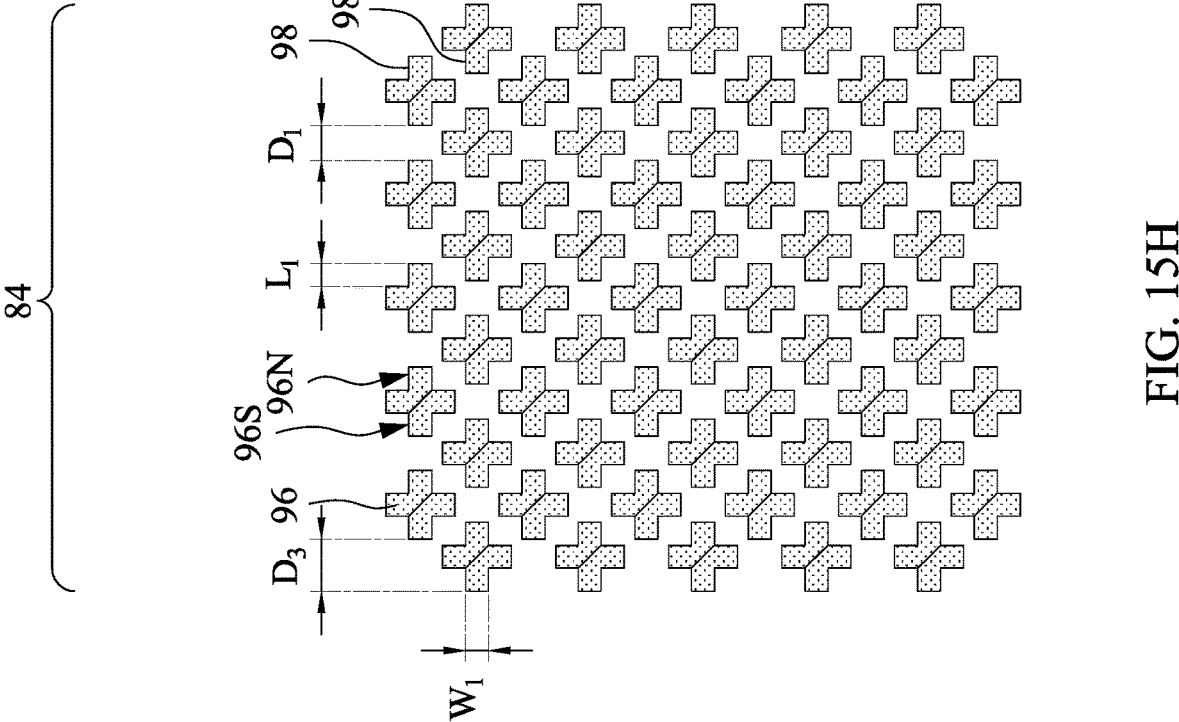
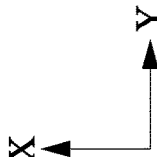
FIG. 15H

WAFER BONDING METHOD AND BONDED DEVICE STRUCTURE

PRIORITY CLAIM AND CROSS-REFERENCE

This application claims the benefit of U.S. Provisional Application No. 63/321,213, filed on Mar. 18, 2022, which application is hereby incorporated herein by reference.

BACKGROUND

Since the development of the integrated circuit (IC), the semiconductor industry has experienced continued rapid growth due to continuous improvements in the integration density of various electronic components (e.g., transistors, diodes, resistors, capacitors, etc.). For the most part, these improvements in integration density have come from repeated reductions in minimum feature size, which allows more components to be integrated into a given area. As the demand for miniaturization, higher speed, greater bandwidth, and lower power consumption and latency has grown, there has grown a need for smaller and more creative techniques for packaging semiconductor dies.

Stacked semiconductor devices have emerged as an effective technique for further reducing the physical size of a semiconductor device. In a stacked semiconductor device, active circuits such as logic and memory circuits are fabricated on different semiconductor wafers. Two or more semiconductor wafers may be bonded together through suitable bonding techniques to further reduce the form factor of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-4B are views of intermediate steps during a process for forming an alignment mark for a wafer, in accordance with some embodiments.

FIG. 5 is a diagram of a wafer bonding method, in accordance with some embodiments.

FIGS. 6-14 are various views of intermediate steps during a wafer bonding method, in accordance with some embodiments.

FIGS. 15A-15H are top-down views of alignment marks, in accordance with various embodiments.

DETAILED DESCRIPTION

Figure 1:
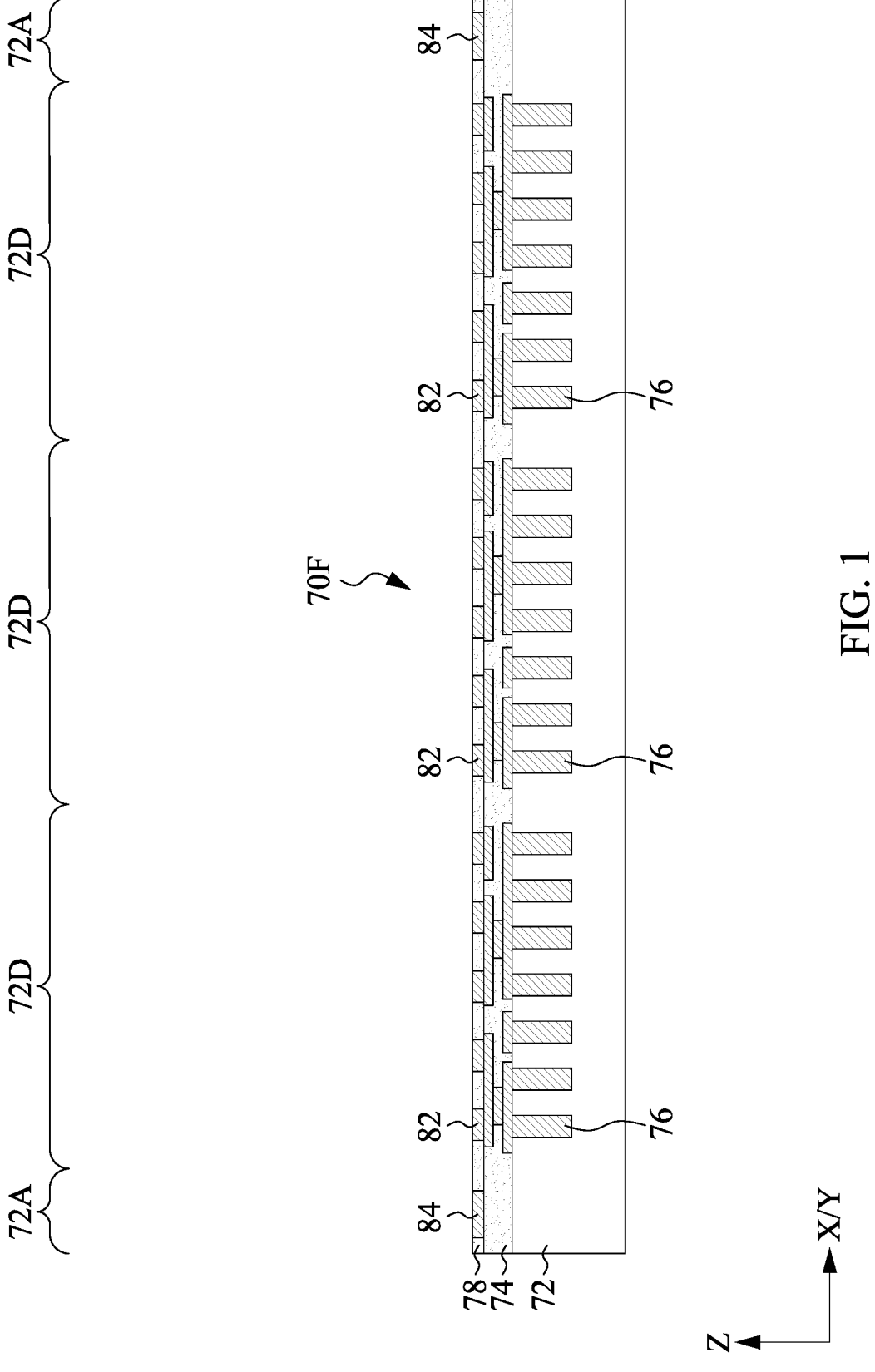
FIG. 1 is a cross-sectional view of a wafer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, magnetic alignment marks are formed in wafers, and are utilized in an alignment process during bonding of the wafers. Specifically, two wafers may be formed with alignment marks that have opposite magnetic polarity. As a result, the alignment marks of the wafers are magnetically attracted to one another when the wafers are bonded together. The wafers may thus be magnetically self-aligned during bonding, which may reduce misalignment between the bonded wafers.

FIG. 1 is a cross-sectional view of a wafer 70, in accordance with some embodiments. Two wafers 70 will be bonded in subsequent processing to form a bonded wafer structure. The wafer 70 includes a semiconductor substrate 72, an interconnect structure 74, conductive vias 76, a dielectric layer 78, bonding pads 82, and alignment marks 84.

The wafer 70 has multiple device regions 72D, which each include features for a semiconductor die. The semiconductor dies may be integrated circuits dies, interposers, or the like. Each integrated circuit die may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device (e.g., image sensor die), a micro-electro-mechanical-system (MEMS) device, a signal processing device (e.g., digital signal processing (DSP) die), a front-end device (e.g., analog front-end (AFE)dies), the like, or combinations thereof (e.g., a system-on-a-chip (SoC) die).

In the illustrated embodiment, the wafer 70 additionally has multiple alignment mark regions 72A, and one or more of the alignment marks 84 are in each of the alignment mark regions 72A. The alignment mark regions 72A (including the alignment marks 84) may be disposed at the edges of the wafer 70, such that they are around the device regions 72D (including the bonding pads 82). In another embodiment, the alignment marks 84 are in the device regions 72D, and the wafer 70 does not have separate regions for the alignment marks 84.

The semiconductor substrate 72 may be a silicon substrate, doped or undoped, or an active layer of a semiconductor-on-insulator (SOI) substrate. The semiconductor substrate 72 may include other semiconductor materials, such as germanium; a compound semiconductor including silicon carbide, gallium arsenic, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 72 has an active surface (e.g., the surface facing upwards in FIG. 1), sometimes called a front side, and an inactive surface (e.g., the surface facing downwards in FIG. 1), sometimes called a back side.

Devices (not separately illustrated) may be formed at the active surface of the semiconductor substrate 72. The devices may be active devices (e.g., transistors, diodes, etc.) and/or passive devices (e.g., capacitors, resistors, etc.). An interconnect structure 74 is over the active surface of the semiconductor substrate 72. The interconnect structure 74 interconnects the devices to form an integrated circuit. The interconnect structure may be formed of, for example, metallization patterns in dielectric layers, and may be formed by a damascene process, such as a single damascene process, a dual damascene process, or the like. The metallization patterns include metal lines and vias formed in one or more dielectric layers. The metallization patterns of the interconnect structure 74 are electrically coupled to the devices.

The conductive vias 76 extend into the interconnect structure 74 and/or the semiconductor substrate 72. The conductive vias 76 are electrically coupled to metallization patterns of the interconnect structure 74. The conductive vias 76 may be through-substrate vias, such as through-silicon vias. As an example to form the conductive vias 76, recesses can be formed in the interconnect structure 74 and/or the semiconductor substrate 72 by, for example, etching, milling, laser techniques, a combination thereof, or the like. A thin barrier layer may be conformally deposited in the recesses, such as by CVD, atomic layer deposition (ALD), physical vapor deposition (PVD), thermal oxidation, a combination thereof, or the like. The barrier layer may be formed from an oxide, a nitride, a carbide, combinations thereof, or the like. A conductive material may be deposited over the barrier layer and in the recesses. The conductive material may be formed by an electro-chemical plating process, CVD, ALD, PVD, a combination thereof, or the like. Examples of conductive materials include copper, tungsten, aluminum, silver, gold, a combination thereof, or the like. Excess conductive material and barrier layer is removed from a surface of the interconnect structure 74 or the semiconductor substrate 72 by, for example, a CMP. The remaining portions of the barrier layer and conductive material in the recesses form the conductive vias 76.

The dielectric layer 78 is at the front side 70F of the wafer 70. The dielectric layer 78 is in and/or on the interconnect structure 74. In some embodiments, the dielectric layer 78 is an upper dielectric layer of the interconnect structure 74. In some embodiments, the dielectric layer 78 is a passivation layer on the interconnect structure 74. The dielectric layer 78 may be formed of silicon oxide, silicon nitride, polybenzoxazole (PBO), polyimide, a benzocyclobuten (BCB) based polymer, the like, or a combination thereof, which may be formed, for example, by chemical vapor deposition (CVD), spin coating, lamination, or the like.

The bonding pads 82 are at the front side 70F of the wafer 70. The bonding pads 82 may be conductive pillars, pads, or the like, to which external connections can be made. The bonding pads 82 are in and/or on the interconnect structure 74. In some embodiments, the bonding pads 82 are part of an upper metallization pattern of the interconnect structure 74. In some embodiments, the bonding pads 82 include post-passivation interconnects that are electrically coupled to the upper metallization pattern of the interconnect structure 74. The bonding pads 82 can be formed of a conductive material, such as a metal, such as copper, aluminum, or the like, which can be formed by, for example, plating, or the like. The dielectric layer 78 is laterally disposed around the bonding pads 82.

The alignment marks 84 are at the front side 70F the wafer 70. The alignment marks 84 are in and/or on the interconnect structure 74. In some embodiments, the alignment marks 84 are part of an upper metallization pattern of the interconnect structure 74. In some embodiments, the alignment marks 84 are formed in the dielectric layer 78, separately from the bonding pads 82. The dielectric layer 78 is laterally disposed around the alignment marks 84. A planarization process can be applied to the various layers so that the top surfaces of the dielectric layer 78, the bonding pads 82, and the alignment marks 84 are substantially coplanar (within process variations) and are exposed at the front side 70F of the wafer 70. The planarization process may be a chemical mechanical polish (CMP), an etch-back, combinations thereof, or the like.

As will be subsequently described in greater detail, the planarized front sides 70F of two wafers 70 will be bonded in a face-to-face manner. The alignment marks 84 have a predetermined shape and/or pattern that can be recognized using a camera, so that the wafers 70 may be optically aligned using the alignment marks 84 during wafer bonding. Additionally, and as will be subsequently described in greater detail, the alignment marks 84 are formed of a magnetic material so that the alignment marks 84 of the wafers 70 will be magnetically attracted to one another during alignment, thereby improving the accuracy of wafer alignment. Further yet, the magnetic material of the alignment marks 84 has a high transparency at wavelengths of light used during optical alignment, such as infrared light, such as light having a wavelength of about 1.1 μm (such as in the range of 0.3 μm to 3 μm). Forming the alignment marks 84 of a material with a high transparency can increase the accuracy of optical alignment.

In some embodiments, the magnetic material of the alignment marks 84 is different from the conductive material of the bonding pads 82. The magnetic material of the alignment marks 84 may have a greater resistivity than the conductive material of the bonding pads 82, and may have a greater transparency than the conductive material of the bonding pads 82. In such embodiments, the alignment marks 84 have a stronger magnetization than the bonding pads 82.

In other embodiments, the alignment marks 84 and the bonding pads 82 are formed of the same magnetic material. As such, the bonding pads 82 are also magnetic. Forming the bonding pads 82 to also be magnetic can help increase the magnetic attraction between wafers during alignment, thereby improving the accuracy of wafer alignment. In such embodiments, the alignment marks 84 may have a magnetization of the same strength as the bonding pads 82.

The alignment marks 84 may be formed at sites where, depending on the design of the semiconductor dies, additional bonding pads 82 would otherwise be formed. Thus, the alignment marks 84 are in the same device layer (e.g., the dielectric layer 78) as the bonding pads 82. Accordingly, the pattern of the bonding pads 82 and the alignment marks 84 may have increased design flexibility.

Figure 2A:
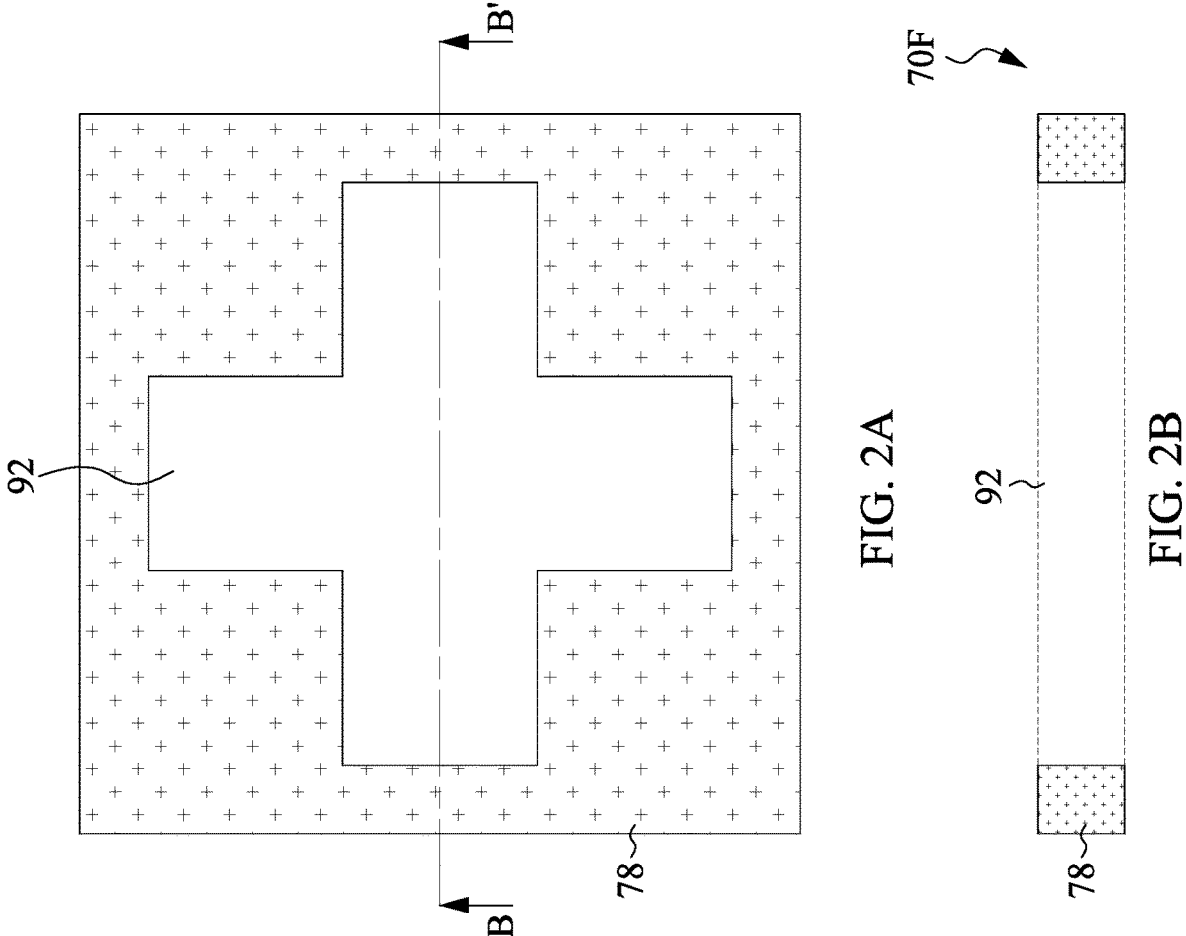
Figure 2B:
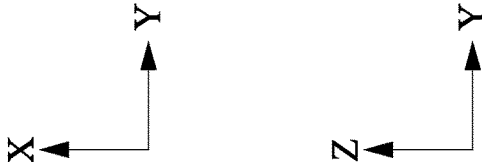
Figure 3A:
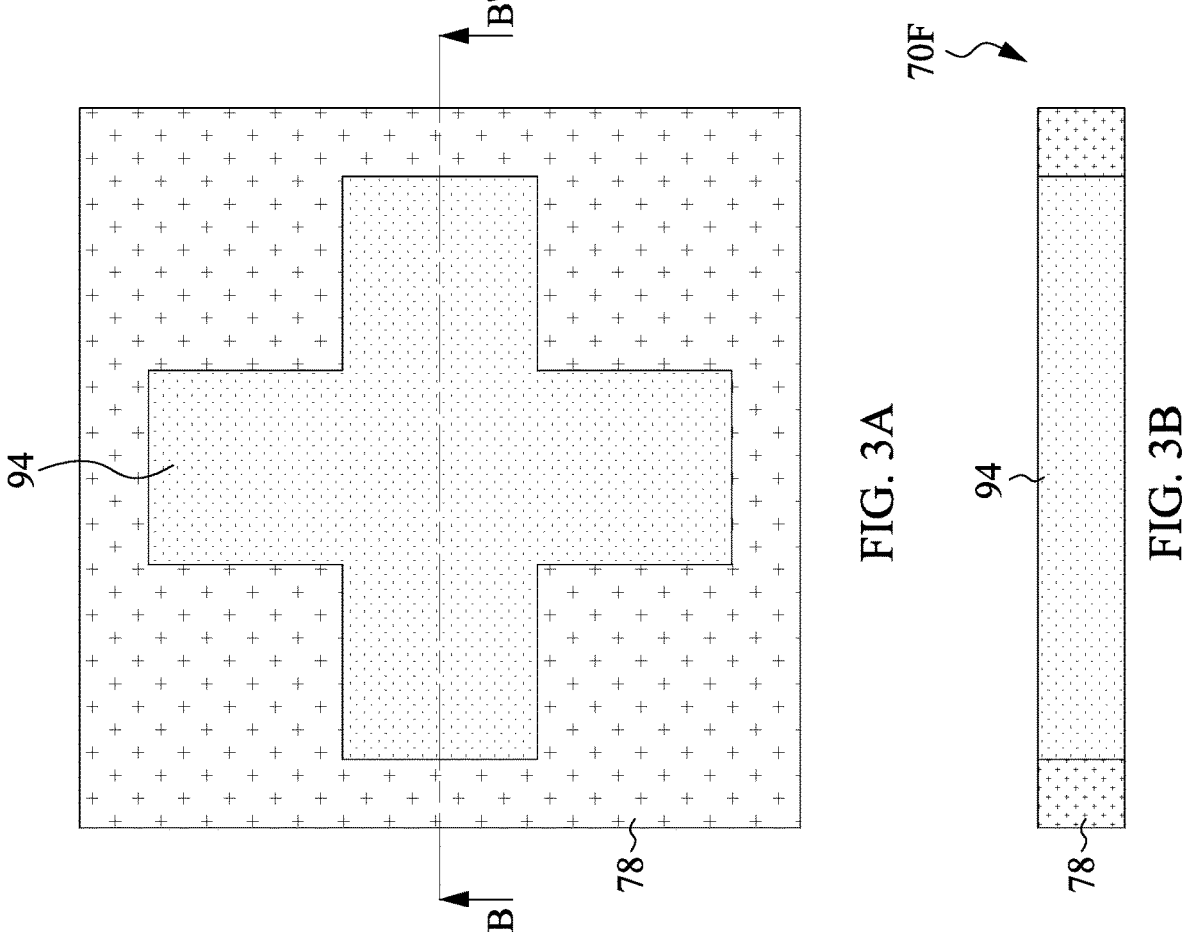
Figure 3B:
Figures 4A, 4B:
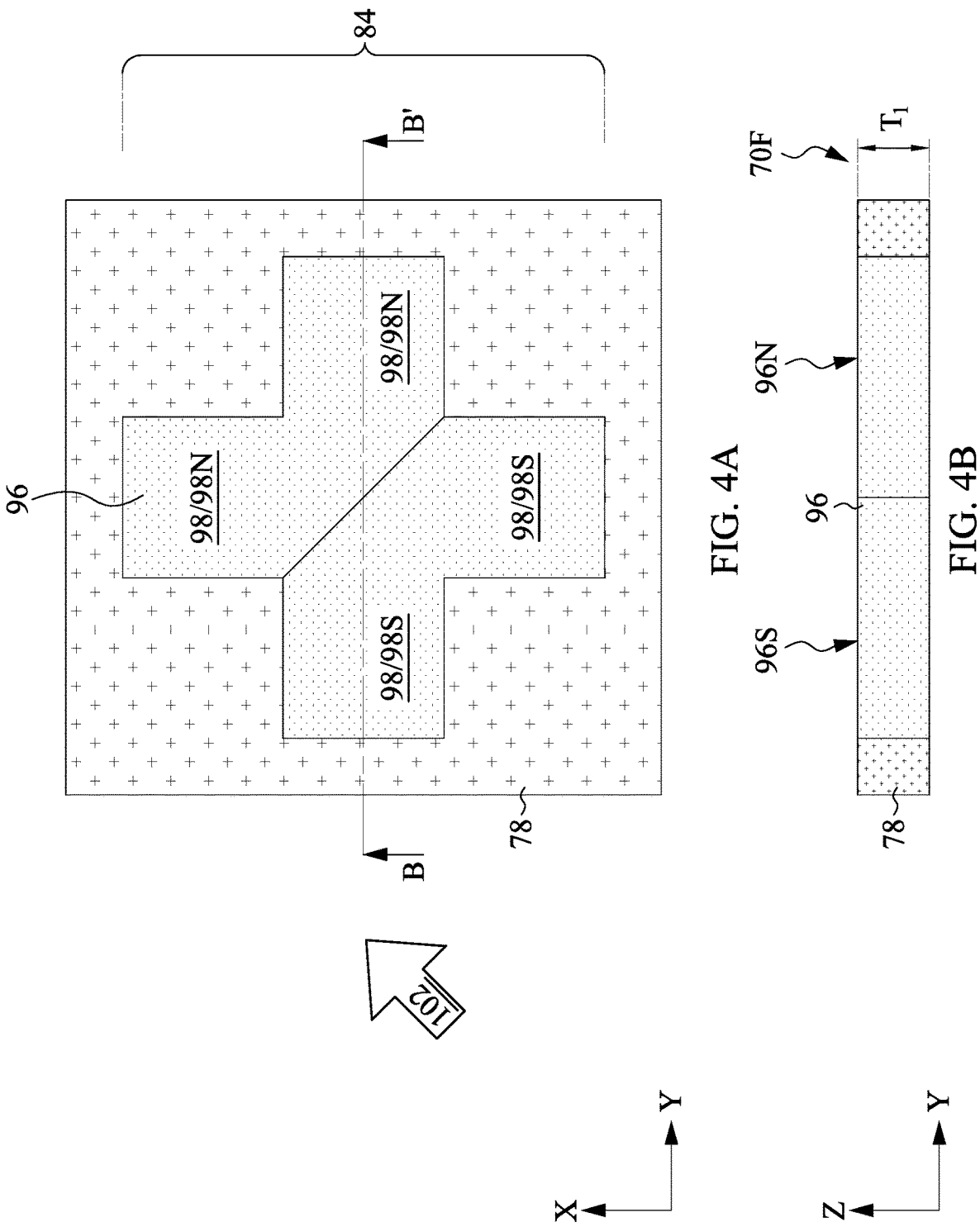

FIGS. 2A-4B are views of intermediate steps during a process for forming an alignment mark 84 for a wafer 70, in accordance with some embodiments. FIGS. 2A, 3A, and 4A are top-down views. FIGS. 2B, 3B, and 4B are cross-sectional views shown along cross-section A-A' in FIGS. 2A, 3A, and 4A, respectively. The alignment mark 84 (see FIG. 4A) includes one or more magnetic feature(s) 96, which have a predetermined shape. In this embodiment, the alignment mark 84 is a single magnetic feature 96, which is a magnetic cross. According to various embodiments (subsequently described for FIGS. 15A-15H), an alignment mark 84 may be a single magnetic cross, an alignment mark 84 may be a single magnetic bar, or an alignment mark 84 may include multiple magnetic crosses/bars.

In FIGS. 2A-2B, a trench 92 for the magnetic feature is patterned in the dielectric layer 78. The trench 92 may be a recess extending into the dielectric layer 78, or may be an opening extending through the dielectric layer 78. The dielectric layer 78 may be patterned by any acceptable process, such as by exposing the dielectric layer 78 to light and developing it when the dielectric layer 78 is a photosensitive material, or by etching using, for example, an anisotropic etch. Timed etching processes may be used to stop the etching of the trench 92 after the trench 92 reaches a desired depth. The depth of the trench 92 determines the thickness of the resulting magnetic feature 96 (see FIG. 4B), which will be subsequently described in greater detail.

In FIGS. 3A-3B, a ferromagnetic feature 94 is formed in the trench 92. The ferromagnetic feature 94 is formed of a ferromagnetic material that can be magnetized to form a permanent magnet. Examples of ferromagnetic materials include iron (Fe), cobalt (Co), nickel (Ni), alloys thereof such as cobalt-iron-nickel ($Co_xFe_yNi_z$, where x, y, and z are each in the range of 0 to 100), multilayers thereof, or the like, which may be formed by a technique such as deposition (e.g., PVD), plating (e.g., electroplating or electroless plating), or the like. The ferromagnetic material may be doped or undoped. For example, the ferromagnetic material may be cobalt-iron-nickel doped with boron, silicon, molybdenum, combinations thereof, or the like. In some embodiments, the ferromagnetic feature 94 is a single continuous layer of a ferromagnetic material. In some embodiments, the ferromagnetic feature 94 is a conductive material that is doped with a ferromagnetic material.

As an example to form the ferromagnetic feature 94, a layer of ferromagnetic material may be conformally formed in the trench 92 and on the dielectric layer 78. A removal process is performed to remove the excess portions of the ferromagnetic material, which excess portions are over the top surface of the dielectric layer 78, thereby forming the ferromagnetic feature 94. After the removal process, the ferromagnetic material has portions left in the trench 92 (thus forming the ferromagnetic feature 94). In some embodiments, a planarization process such as a chemical mechanical polish (CMP), an etch-back process, combinations thereof, or the like may be utilized. After the planarization process, the top surfaces of the dielectric layer 78, the bonding pads 82 (see FIG. 1), and the ferromagnetic feature 94 are substantially coplanar (within process variations). The substantially coplanar top surfaces of those features are at the front side 70F of the wafer, and the resulting planar surfaces may be the surfaces that are subsequently used for wafer bonding.

In FIGS. 4A-4B, the ferromagnetic feature 94 is magnetized to form a magnetic feature 96. The magnetic feature 96 is a permanent magnet, having a north pole 96N and a south pole 96S. The magnetic feature 96 has a stronger magnetization than the ferromagnetic feature 94. In some embodiments, the magnetic feature 96 has a magnetization (M, magnetic moment per volume) of about 750 $emu/cm^3$ (such as in the range of 250 $emu/cm^3$ to 2000 $emu/cm^3$). The ferromagnetic feature 94 is magnetized by exposing the ferromagnetic feature 94 to a magnetic field 102 (subsequently described) that induces magnetization in the ferromagnetic feature 94.

In this embodiment where the magnetic feature 96 is a magnetic cross, the magnetic cross includes four arms 98 that protrude from a central portion. A first pair of adjacent arms 98N forms the north pole 96N of the magnetic cross. The arms 98N include including one arm 98N extending along a first direction (e.g., the Y-direction) and one arm 98N extending along a second direction (e.g., the X-direction). A second pair of adjacent arms 98S forms the south pole 96S of the magnetic cross. The arms 98S include one arm 98S extending along the first direction (e.g., the Y-direction) and one arm 98S extending along the second direction (e.g., the X-direction). The width and length of the arm 98 will be subsequently described for FIGS. 15A-15B. The magnetic feature 96 has a thickness $T_1$ along a third direction (e.g., the Z-direction). In some embodiments, the thickness $T_1$ is about 0.5 μm (such as in the range of 0.3 μm to 0.7 μm). In some embodiments, the alignment mark 84 (e.g., the magnetic cross) has a total length along the first direction (e.g., the Y-direction) of about 50 μm (such as in the range of 10 μm to 100 μm), and has a total width along the second direction (e.g., the X-direction) of about 50 μm (such as in the range of 10 μm to 100 μm).

Although not separately illustrated in FIGS. 2A-4B, should be appreciated that a plurality of alignment marks 84 may simultaneously be formed. For example, a plurality of trenches 92 may be patterned in the dielectric layer 78, the trenches 92 may be filled with respective ferromagnetic features 94, and the ferromagnetic features 94 may be magnetized to form magnetic features 96. The alignment marks 84 (including the magnetic feature 96 of each alignment mark 84) may be spaced apart by a distance of about 5 μm (such as in the range of 1 μm to 20 μm).

The magnetic field 102 utilized to magnetize the magnetic feature 96 has a direction that is parallel to the front side 70F (see FIG. 4B) of the wafer, and forms a non-zero angle with each of the arms 98 of the magnetic feature 96. The non-zero angle is between 0 degrees and 90 degrees. In some embodiments, the non-zero angle is a 45 degree angle. As such, the direction of the magnetization induced in the magnetic feature 96 is at a 45 degree angle with the arms 98 of the magnetic feature 96. The magnetic field 102 may be produced by an electromagnet. In some embodiments, the magnetic field 102 has a magnetic field strength of about 1 Tesla (such as in the range of 0.01 Tesla to 2 Tesla), and is applied for a duration of about 5 seconds (such as in the range of 0.01 seconds to 60 seconds).

FIG. 5 is a diagram of a wafer bonding method 500, in accordance with some embodiments. The wafer bonding method 500 will be described in conjunction with FIGS. 6-14, which are various views of intermediate steps during the wafer bonding method 500, in accordance with some embodiments. In the wafer bonding method 500, two wafers 70 (including a first wafer 70A and a second wafer 70B, see FIG. 6) are bonded in a face-to-face manner. In this embodiment, the wafers 70 are bonded in a face-to-face manner by hybrid bonding, such that the front side of the first wafer 70A is bonded to the front side of the second wafer 70B through dielectric-to-dielectric bonds and metal-to-metal bonds. Hybrid bonding allows the wafers 70A, 70B to be bonded without using any adhesive material (e.g., die attach film) or eutectic material (e.g., solder).

In step 502, a first wafer 70A and a second wafer 70B, including, respectively, first alignment marks 84A and second alignment marks 84B (subsequently described for FIG. 7) are formed. One of the wafers 70 will be flipped when the wafers 70 are bonded to one another. Because of this, the wafers 70A, 70B are formed with alignment marks 84A, 84B that include magnetic features 96A, 96B having opposite magnetic polarity. More specifically, the first magnetic features 96A have opposite magnetic polarity from the second magnetic features 96B. As such, the wafers 70A, 70B will be magnetically attracted to one another when they are placed face-to-face.

Referring to FIG. 6 (a simplified top-down view of the wafers 70A, 70B) and FIG. 7 (a top-down view of alignment marks 84A, 84B), the wafers 70A, 70B are shown at a similar step of processing as described for FIGS. 4A-4B, where the magnetic features 96A, 96B are magnetized. When magnetizing the magnetic features 96A, 96B, different magnetic fields 102A, 102B are applied to the wafers 70A, 70B. Specifically, a first magnetic field 102A is applied to the first wafer 70A to magnetize the first magnetic features 96A of the first wafer 70A, and a second magnetic field 102B is applied to the second wafer 70B to magnetize the second magnetic features 96B of the second wafer 70B. The first magnetic field 102A may (or may not) have the same strength as the second magnetic field 102B, and the first magnetic field 102A is anti-parallel to the second magnetic field 102B such that the first magnetic field 102A has opposite polarity (e.g., opposite direction) from the second magnetic field 102B. As a result, the magnetization of the first magnetic features 96A may (or may not) have the same strength as the magnetization of the second magnetic features 96B, but the magnetization of the first magnetic features 96A has opposite polarity from the magnetization of the second magnetic features 96B. As such, the first magnetic features 96A will be attracted to the second magnetic features 96B when the wafers 70A, 70B are placed face-to-face. The directions of the magnetic fields 102A, 102B are relative to the respective wafers 70A, 70B. In some embodiments, the directions of the magnetic fields 102A, 102B are relative to notches 88 in the wafers 70A, 70B.

Figure 8:
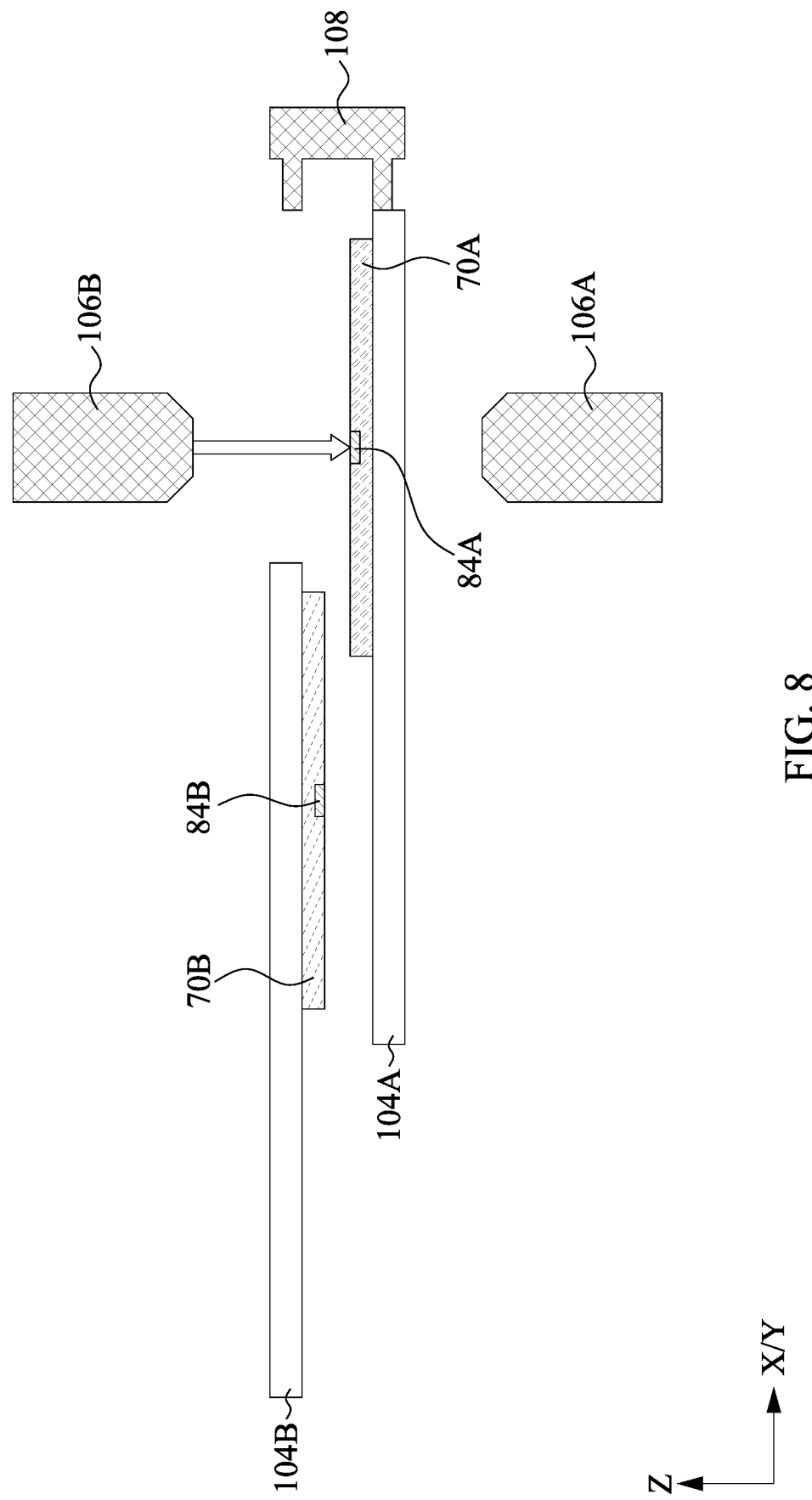
Figure 9:
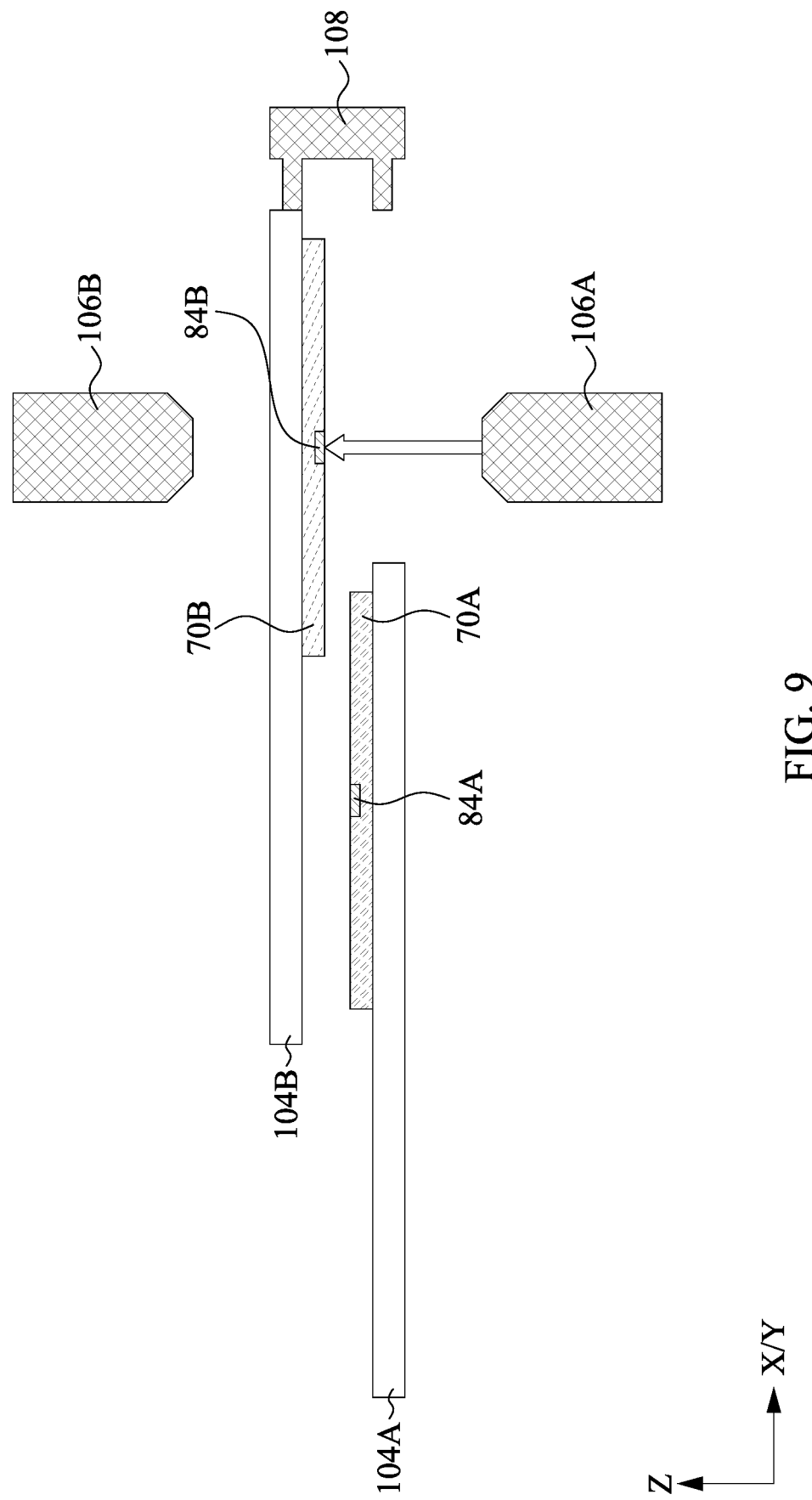
Figure 10:
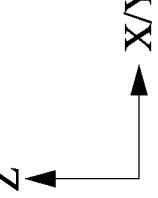

In step 504, the wafers 70A, 70B are coarsely aligned in a first alignment process. Referring to FIGS. 8-10, the wafers 70A, 70B are shown during steps of the first alignment process. One of each of the alignment marks 84A, 84B are schematically illustrated, but as previously noted, each of the wafers 70A, 70B may include a plurality of alignment marks. The first alignment process is an optical alignment process that utilizes cameras 106A, 106B, such as infrared cameras. The first wafer 70A is placed on a lower chuck 104A, and the second wafer 70B is placed on an upper chuck 104B. The chucks 104A, 104B are operable to horizontally move the wafers 70A, 70B (e.g., in the X/Y-plane) and to vertically move the wafers 70A, 70B (e.g., along the Z-direction). During the first alignment process, the chucks 104A, 104B are positioned far enough apart that the magnetic attraction between the alignment marks 84A, 84B is insufficient to move the wafers 70A, 70B. In some embodiments, the chucks 104A, 104B are positioned so that a gap $G_1$ (see FIG. 10) between the wafers 70A, 70B (e.g., between the alignment marks 84A, 84B) is about 3 mm (such as in the range of 0.1 mm to 10 mm).

The first alignment process includes searching for the first alignment marks 84A of the first wafer 70A using the upper camera 106B, as shown by FIG. 8. The upper camera 106B is disposed at a fixed location, and the lower chuck 104A is horizontally moved in the X/Y-plane until the upper camera

106B detects the first alignment marks 84A are at desired locations that indicate correct wafer alignment. The position of the lower chuck 104A (which is an aligned position of the lower chuck 104A) is then measured using a positioning sensor 108. The aligned position of the lower chuck 104A is recorded. The lower chuck 104A may then be retracted so that it is out of the line-of-sight of the cameras 106A, 106B.

The first alignment process further includes searching for second alignment marks 84B of the second wafer 70B using the lower camera 106A, as shown by FIG. 9. The lower camera 106A is disposed at a fixed location, and the upper chuck 104B is horizontally moved in the X/Y-plane until the lower camera 106A detects the second alignment marks 84B are at desired locations that indicate correct wafer alignment. The position of the upper chuck 104B (which is an aligned position of the upper chuck 104B) is then measured using the positioning sensor 108. The aligned position of the upper chuck 104B is recorded.

The first alignment process further includes horizontally moving the chucks 104A, 104B in the X/Y-plane to their aligned positions, as determined by the positioning sensor 108. When the chucks 104A, 104B are in their aligned positions, the first wafer 70A is coarsely aligned with the second wafer 70B. After the wafers 70A, 70B are coarsely aligned, the amount of misalignment between them may be large. In some embodiments, the wafers 70A, 70B have more than about 0.2 μm of misalignment (such as in the range of 0.2 μm to 0.4 μm of misalignment).

Figure 11:
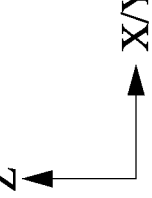

In step 506, the wafers 70A, 70B are finely aligned in a second alignment process. Referring to FIG. 11, the wafers 70A, 70B are shown during the second alignment process. The second alignment process is a magnetic alignment process that utilizes the alignment marks 84A, 84B. The second alignment process is a self-alignment process. During the second alignment process, the chucks 104A, 104B are positioned close enough together that the magnetic attraction between the alignment marks 84A, 84B is sufficient to move the wafers 70A, 70B. In some embodiments, the chucks 104A, 104B are positioned so that a gap $G_2$ between the wafers 70A, 70B (e.g., between the alignment marks 84A, 84B) is about 0.2 μm (such as in the range of 0.01 μm to 0.5 μm). The chucks 104A, 104B are closer together during the second alignment process than during the first alignment process.

Figure 12:
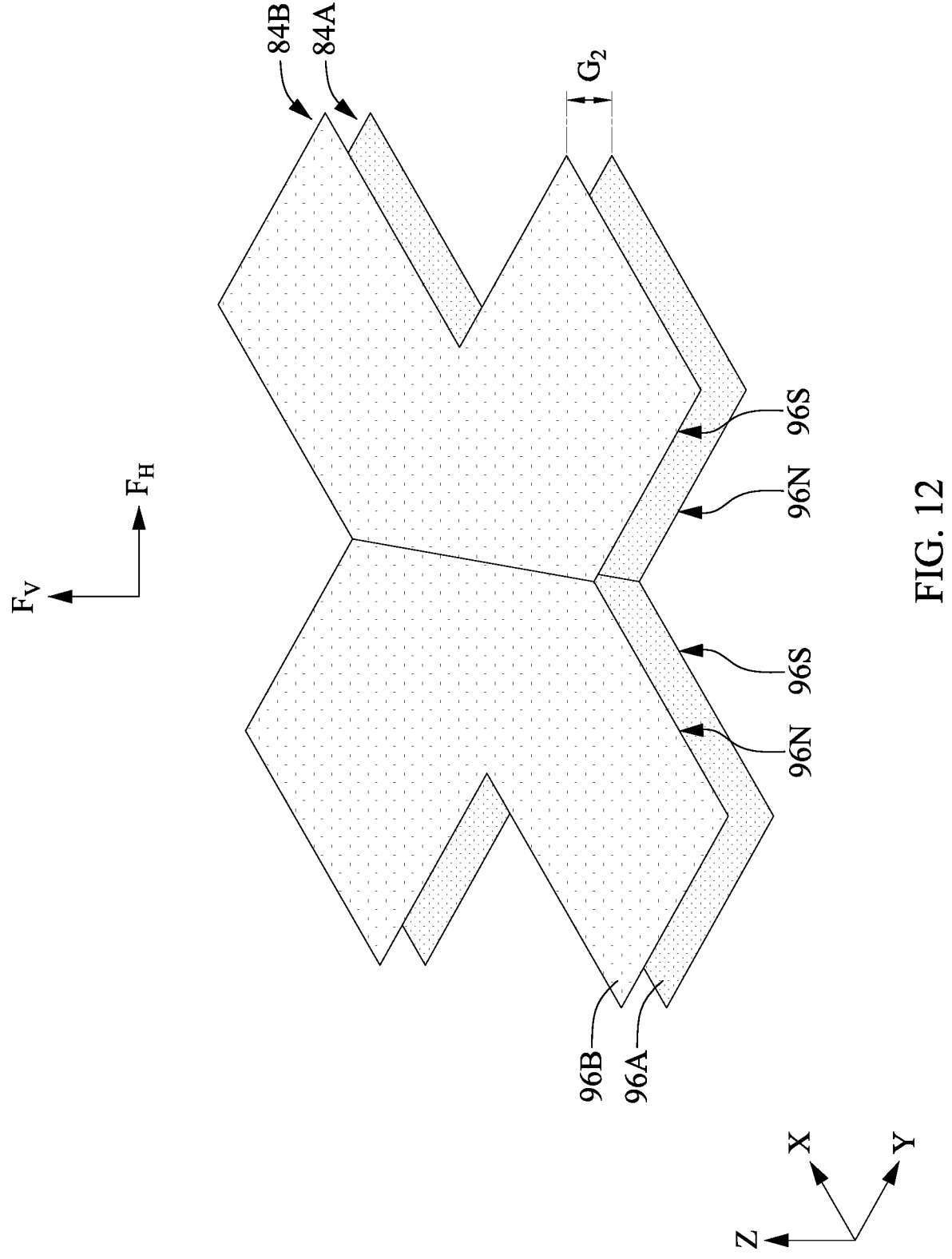

Referring to FIG. 12, some of the magnetic features 96A, 96B of two alignment marks 84A, 84B are shown. Because the magnetic features 96A, 96B are magnetically attracted, the alignment marks 84A, 84B exert two forces on the wafers 70A, 70B (see FIG. 11): a horizontal force $F_H$ (e.g., in the X/Y-plane) and a vertical force $F_V$ (e.g., along the Z-direction). The vertical force $F_V$ draws the wafers 70A, 70B towards each other. The horizontal force $F_H$ draws the north poles 96N of the magnetic features 96A, 96B towards the south poles 96S of the magnetic features 96A, 96B. The horizontal force $F_H$ is strong enough to move the wafers 70A, 70B in the X/Y-plane. As noted above, the magnetic features 96A, 96B of the alignment marks 84A, 84B have opposite magnetic polarity. Because of this, when the wafers 70A, 70B are moved in the X/Y-plane, the north poles 96N of the first magnetic features 96A are aligned with the south poles 96S of the second magnetic features 96B, and the south poles 96S of the first magnetic features 96A are aligned with the north poles 96N of the second magnetic features 96B.

The second alignment process includes vertically moving the chucks 104A, 104B (see FIG. 11) towards each other along the Z-direction until the alignment marks 84A, 84B generate a desired horizontal force $F_H$ and vertical force $F_V$. This begins moving the alignment marks 84A, 84B to aligned positions. Movement of the chucks 104A, 104B is then stopped and a wait is performed in which the chucks 104A, 104B are held at the desired position until the wafers 70A, 70B have finished moving to their aligned positions (e.g., until the north poles 96N are aligned with the south poles 96S). In some embodiments, the second alignment process includes waiting while the chucks 104A, 104B are held at the desired position for a duration of about 500 μs (such as in the range of 10 μs to 5000 μs). When the north poles 96N are aligned with the south poles 96S, the first wafer 70A is finely aligned with the second wafer 70B. After the wafers 70A, 70B are finely aligned, the amount of misalignment between them is small. In some embodiments, the wafers 70A, 70B have less than about 0.1 μm of misalignment (such as in the range of 0.01 μm to 0.5 μm of misalignment). Performing the second alignment process (e.g., magnetic self-alignment) in addition to the first alignment process (e.g., optical alignment) allows the misalignment between the wafers 70A, 70B to be less than if the first alignment process were used alone.

Figure 13:
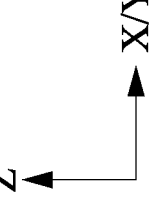
Figure 14:
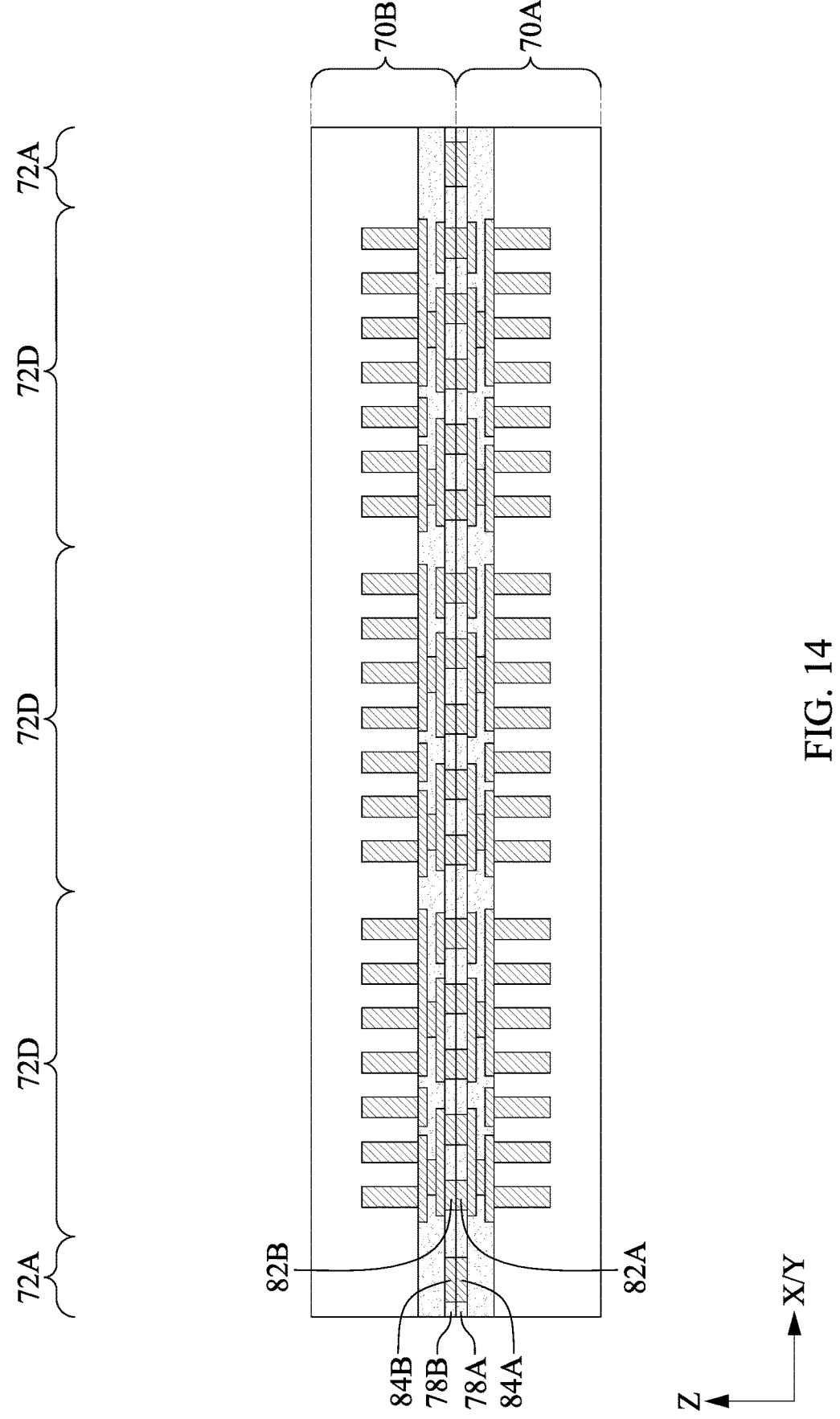

In step 508, a pre-bonding process is performed by bringing the front sides of the wafers 70A, 70B into contact with one another. Referring to FIG. 13, the wafers 70A, 70B are shown after the wafers 70A, 70B are contacted. During the pre-bonding, a small pressing force is applied by vertically moving the chucks 104A, 104B towards each other to press the first wafer 70A against the second wafer 70B. FIG. 14 is a cross-sectional view of the wafers 70A, 70B during bonding. When the wafers 70A, 70B are pressed together, the dielectric layers 78A, 78B are brought into contact. The pre-bonding is performed at a low temperature, such as about room temperature (such as in the range of 15° C. to 30° C.), and after the pre-bonding, the dielectric layers 78A, 78B are bonded to each other.

In step 510, an annealing process is performed to improve the bonding strength between the wafers 70A, 70B. During the annealing process, the dielectric layers 78A, 78B; the bonding pads 82A, 82B; and the alignment marks 84A, 84B are annealed at a high temperature, such as a temperature in the range of 100° C. to 450° C. After the annealing, bonds, such as fusions bonds, are formed bonding the dielectric layers 78A, 78B. For example, the bonds can be covalent bonds between the material of the dielectric layer 78A and the material of the dielectric layer 78B. The bonding pads 82A, 82B are connected to each other with a one-to-one correspondence. The bonding pads 82A, 82B may be in physical contact after the pre-bonding, or may expand to be brought into physical contact during the annealing. Further, during the annealing, the material of the bonding pads 82A, 82B (e.g., copper) intermingles, so that metal-to-metal bonds are also formed. The alignment marks 84A, 84B are also connected to each other with a one-to-one correspondence, and metal-to-metal bonds may be formed between the alignment marks 84A, 84B in a similar manner as the bonding pads 82A, 82B. Hence, the resulting bonds between the wafers 70A, 70B are hybrid bonds that include both dielectric-to-dielectric bonds and metal-to-metal bonds.

Additional processing may be performed after the wafers 70A, 70B are bonded. For example, and referring again to FIG. 14, the bonded wafer structure may be singulated by sawing along scribe line regions, e.g., between the device regions 72D. The sawing singulates the bonded devices in each device region 72D to form bonded device structures. In embodiments where the alignment marks 84 are formed in the device regions 72D, the bonded device structures may include the alignment marks 84. In embodiments where the alignment marks 84 are formed in separate alignment mark regions 72A, the bonded device structures may not include the alignment marks 84.

FIGS. 15A-15H are top-down views of alignment marks 84, in accordance with various embodiments. As noted above, each alignment mark 84 includes one or more magnetic feature(s) 96. Any combination of the alignment marks 84 described for FIGS. 15A-15H may be formed for a single wafer 70.

As shown by FIGS. 15A-15B, an alignment mark 84 may be a single magnetic feature 96, where the magnetic feature 96 is a magnetic cross. As previously described for FIGS. 4A-4B, the magnetic cross is formed by applying a magnetic field 102 (see FIG. 4A) to a ferromagnetic feature, thereby forming a magnetic feature. When the magnetic feature 96 is a magnetic cross, the magnetic field 102 (see FIG. 4A) utilized to magnetize the magnetic cross has a direction that forms a non-zero angle with each of the arms 98 of the magnetic cross. The non-zero angle is between 0 degrees and 90 degrees.

In some embodiments, as shown by FIG. 15A, the magnetic cross has arms 98 of equal widths $W_1$ and equal lengths $L_1$, with the length $L_1$ being greater than the width $W_1$. Specifically, each arm 98 has a length $L_1$ along a direction radiating from the central portion, and a width $W_1$ along a direction perpendicular to the direction radiating from the central portion. In some embodiments, the length $L_1$ is in the range of 15 μm to 20 μm, and the width $W_1$ is in the range of 15 μm to 20 μm. In other embodiments (not separately illustrated), the arms 98 of the magnetic cross have different widths $W_1$ and/or different lengths $L_1$.

In some embodiments, as shown by FIG. 15B, the magnetic cross has arms 98 of equal widths $W_1$ and equal lengths $L_1$, with the length $L_1$ being less than the width $W_1$. Specifically, each arm 98 has a length $L_1$ along a direction radiating from the central portion, and a width $W_1$ along a direction perpendicular to the direction radiating from the central portion. The width $W_1$ in the embodiment of FIG. 15B is greater than the width $W_1$ in the embodiment of FIG. 15A. In some embodiments, the length $L_1$ is in the range of 15 μm to 20 μm, and the width $W_1$ is in the range of 15 μm to 20 μm. In other embodiments (not separately illustrated), the arms 98 of the magnetic cross have different widths $W_1$ and/or different lengths $L_1$.

The strength of the vertical force $F_V$ (see FIG. 12) produced by a magnetic cross during wafer bonding is determined by its thickness $T_1$ (previously described) and the width $W_1$ of its arms 98. Table 1 lists vertical forces $F_V$ generated by magnetic crosses of various thicknesses and arm widths. As demonstrated by Table 1, magnetic crosses with wider arms (e.g., as shown by FIG. 15B) generate a greater vertical force $F_V$ than magnetic crosses with narrower arms (e.g., as shown by FIG. 15A), given the same thickness $T_1$.

TABLE 1

|  | $W_1$ of 15 μm | $W_1$ of 20 μm |
| --- | --- | --- |
| $T_1$ of 0.3 μm | 7.2E-7N | 9.5E-7N |
| $T_1$ of 0.5 μm | 1.5E-6N | 2.2E-6N |
| $T_1$ of 0.7 μm | 2.6E-6N | 3.8E-6N |

As shown by FIGS. 15C-15D, an alignment mark 84 may be a single magnetic feature 96, where the magnetic feature 96 is a magnetic bar. Similar to the embodiments previously described for FIGS. 4A-4B, the magnetic bar is formed by applying a magnetic field 102 (see FIG. 4A) to a ferromagnetic feature. When the magnetic feature 96 is a magnetic bar, the magnetic field 102 (see FIG. 4A) utilized to magnetize the magnetic bar has a direction along the lengthwise direction (e.g., the Y-direction) of the magnetic bar.

In some embodiments, as shown by FIG. 15C, the magnetic bar has a rectangular shape. Specifically, the magnetic bar has a length $L_1$ along a first direction (e.g., the Y-direction) and a width $W_1$ along a second direction (e.g., the X-direction), where the length $L_1$ is greater than the width $W_1$. In some embodiments, the length $L_1$ is in the range of 15 μm to 20 μm, and the width $W_1$ is in the range of 15 μm to 20 μm. The direction of the magnetization of the magnetic bar is along its lengthwise direction (e.g., the Y-direction).

In some embodiments, as shown by FIG. 15D, the magnetic bar has a square shape. Specifically, the magnetic bar has a length $L_2$ along a first direction (e.g., the Y-direction) and a width $W_2$ along a second direction (e.g., the X-direction), where the length $L_2$ is equal to the width $W_2$. The width $W_2$ in the embodiment of FIG. 15D is greater than the width $W_1$ in the embodiment of FIG. 15C. In some embodiments, the length $L_2$ is in the range of 15 μm to 20 μm, and the width $W_2$ is in the range of 15 μm to 20 μm. The direction of the magnetization of the magnetic bar may be along either direction (e.g., the X-direction or the Y-direction).

The strength of the vertical force $F_V$ (see FIG. 12) produced by a magnetic bar during wafer bonding is determined by its thickness $T_1$ (previously described) and its width $W_1$. Table 2 lists vertical forces $F_V$ generated by magnetic bars of various thicknesses and widths. As demonstrated by Table 2, magnetic bars with larger widths (e.g., as shown by FIG. 15D) generate a greater vertical force $F_V$ than magnetic bars with smaller widths (e.g., as shown by FIG. 15C), given the same thickness $T_1$.

TABLE 2

|  | $W_1$ of 15 μm | $W_1$ of 20 μm |
| --- | --- | --- |
| $T_1$ of 0.3 μm | 7.3E−7N | 1.0E−6N |
| $T_1$ of 0.5 μm | 1.5E−6N | 2.1E−6N |
| $T_1$ of 0.7 μm | 2.6E−6N | 3.8E−6N |

As shown by FIGS. 15E-15H, an alignment mark 84 may include a plurality of magnetic features 96. The magnetic features 96 may be magnetic crosses or magnetic bars. Utilizing a plurality of magnetic features 96 for each alignment mark 84 may increase the strength of the vertical force $F_V$ (see FIG. 12) produced by an alignment mark 84 during wafer bonding.

In some embodiments, as shown by FIG. 15E, the alignment mark 84 includes two magnetic features 96, which are magnetic bars. The magnetic features 96 are arranged side-by-side such that their end sides are aligned. In this embodiment, the lengthwise direction of both magnetic features 96 is parallel to the first direction (e.g., the Y-direction). In another embodiment, the lengthwise direction of both magnetic features 96 is parallel to the second direction (e.g., the X-direction).

Figure 15F:
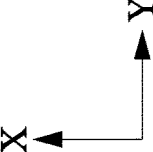

In some embodiments, as shown by FIG. 15F, the alignment mark 84 includes two magnetic features 96, which are magnetic bars. The magnetic features 96 are arranged in different directions. Specifically, a lengthwise direction of a first magnetic feature 96 is parallel to the first direction (e.g., the Y-direction), and a lengthwise direction of a second magnetic feature 96 is parallel to the second direction (e.g., the X-direction).

In some embodiments, as shown by FIG. 15G, the alignment mark 84 includes magnetic features 96, which are magnetic bars, arranged in a grid that includes rows of the magnetic bars. The magnetic bars have a high density in each grid. In some embodiments, each alignment mark 84 includes from 1 to 500 magnetic bars. The magnetic bars in a grid may be smaller than the magnetic bars described for FIGS. 15C-15F. The magnetic bars have a length $L_1$ along a first direction (e.g., the Y-direction) and a width $W_1$ along a second direction (e.g., the X-direction), where the length $L_1$ is greater than the width $W_1$. In some embodiments, the length $L_1$ of each magnetic bar is in the range of 0.2 μm to 20 μm (such as in the range of 0.2 μm to 10 μm), and the width $W_1$ of each magnetic bar is in the range of 0.2 μm to 20 μm (such as in the range of 0.2 μm to 10 μm). The longitudinal axes of the magnetic bars are each aligned along their lengthwise direction (e.g., the Y-direction).

The magnetic bars in a row are separated by a distance $D_1$ along the first direction (e.g., the Y-direction), and the rows of the magnetic bars are separated by a distance $D_2$ along the second direction (e.g., the X-direction). In some embodiments, the distance $D_1$ is in the range of 0.1 μm to 0.4 μm, and the distance $D_2$ is in the range of 0.1 μm to 0.4 μm. Within the grid, alternating rows of the magnetic bars are offset from one another along their lengthwise direction (e.g., the Y-direction) by a distance $D_3$, and every other row of the magnetic bars is aligned along their lengthwise direction (e.g., the Y-direction). In some embodiments, the distance $D_3$ is in the range of 0.4 μm to 9.6 μm. Offsetting alternating rows of the magnetic bars can improve the accuracy of an alignment process utilizing the alignment mark 84.

In some embodiments, as shown by FIG. 15H, the alignment mark 84 includes magnetic features 96, which are magnetic crosses, arranged in a grid that includes rows of the magnetic crosses. The magnetic crosses have a high density in each grid. In some embodiments, each alignment mark 84 includes from 1 to 500 magnetic crosses. The magnetic crosses in a grid may be smaller than the magnetic crosses described for FIGS. 15A-15B. In some embodiments, the length $L_1$ of each arm 98 is in the range of 0.4 μm to 5 μm, and the width $W_1$ of each arm 98 is in the range of 0.4 μm to 5 μm.

The magnetic crosses in a row are separated by a distance $D_1$ along the first direction (e.g., the Y-direction). In some embodiments, the distance $D_1$ is in the range of 0.1 μm to 5 μm. The arms 98 of adjacent rows of magnetic crosses may overlap with one another along the longitudinal axes of those arms 98. Within the grid, alternating rows of the magnetic crosses are offset from one another along their lengthwise direction (e.g., the Y-direction) by a distance $D_3$, and every other row of the magnetic crosses is aligned along their lengthwise direction (e.g., the Y-direction). In some embodiments, the distance $D_3$ is in the range of 0.2 μm to 10 μm. Offsetting alternating rows of the magnetic crosses can improve the accuracy of an alignment process utilizing the alignment mark 84.

Figure 16:
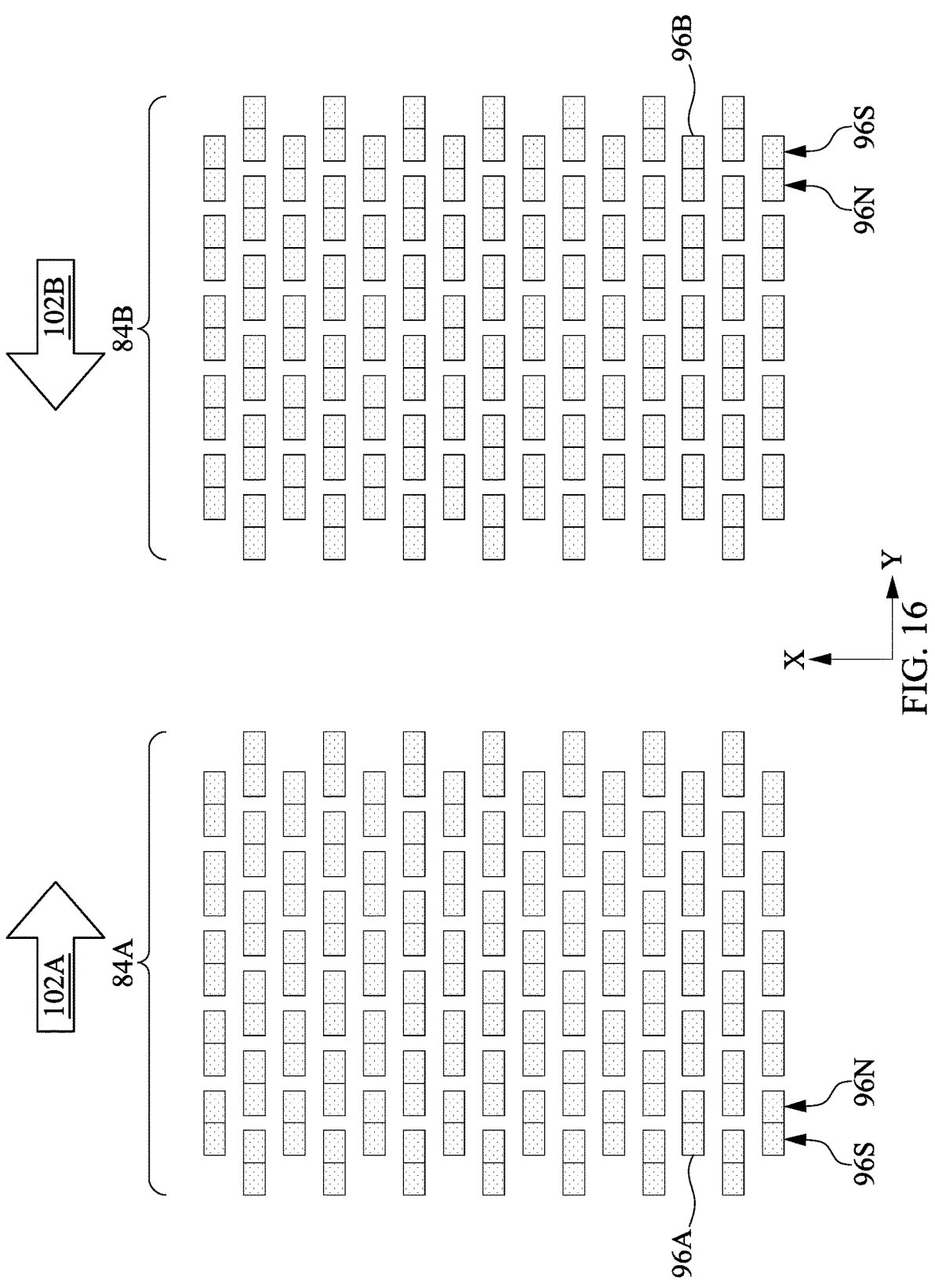
FIGS. 16-17 are views of intermediate steps during a process for forming alignment marks for wafers, in accordance with some other embodiments.
Figure 17:
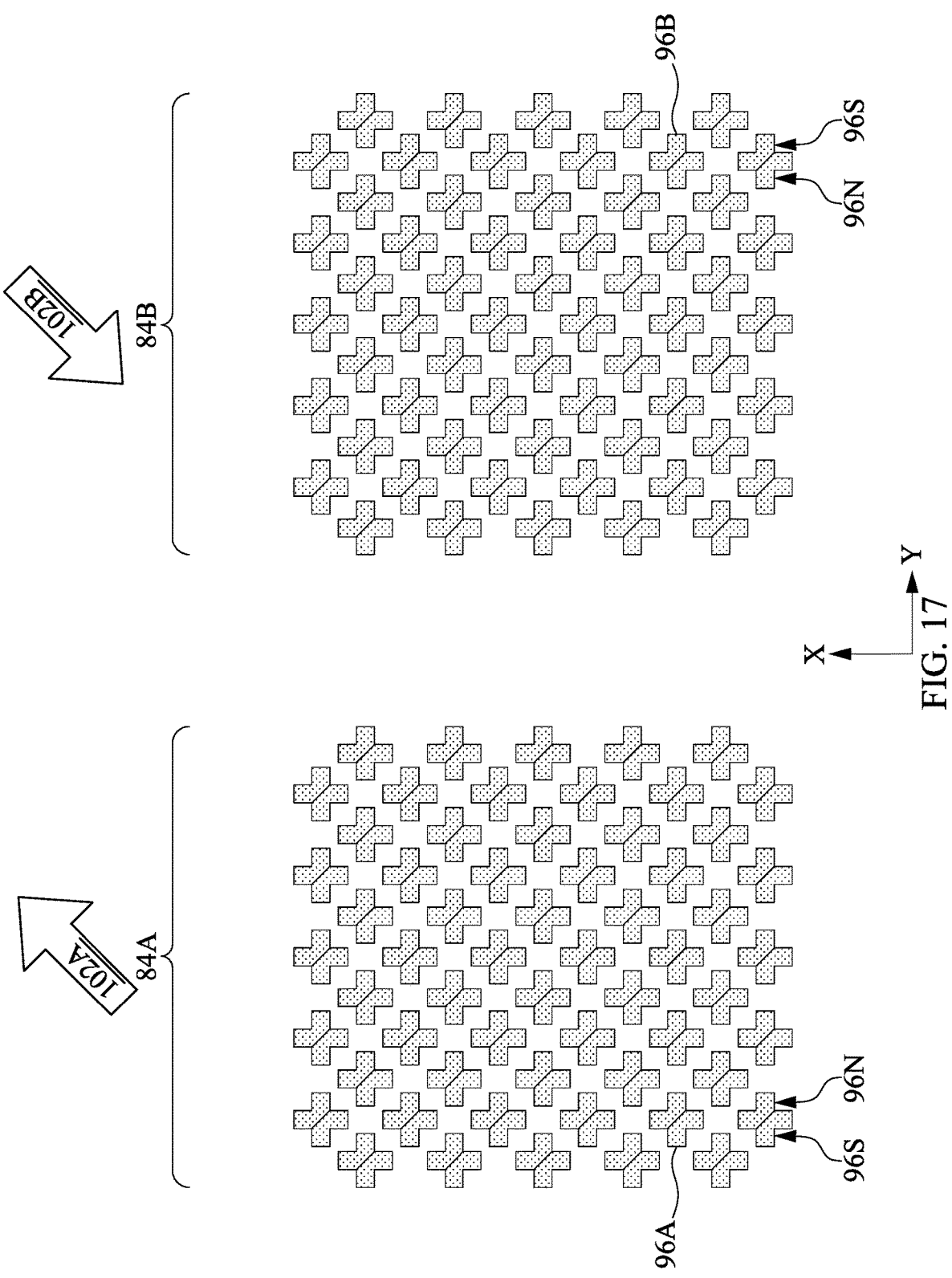

FIGS. 16-17 are views of intermediate steps during a process for forming alignment marks for wafers, in accordance with some other embodiments. As previously noted, different wafers may be formed with alignment marks that include magnetic features having opposite magnetic polarity. FIGS. 16-17 illustrate the alignment marks 84 of FIGS. 15G-15H, respectively, during the magnetization process for the alignment marks 84 (previously described for FIGS. 4A-4B). A first magnetic field 102A is utilized to magnetize the first magnetic features 96A of a first alignment mark 84A for a first wafer. A second magnetic field 102B is utilized to magnetize the second magnetic features 96B of a second alignment mark 84B for a second wafer. The first magnetic field 102A has an opposite magnetic polarity from the second magnetic field 102B. When the magnetic features 96A, 96B are magnetic crosses, as shown by FIG. 17, the first magnetic field 102A forms a first non-zero angle with each of the arms of the first magnetic features 96A, and the second magnetic field 102B forms a second non-zero angle with each of the arms of the second magnetic features 96B.

Embodiments may achieve advantages. Forming the magnetic alignment marks 84 in the wafers 70 may improve the accuracy of an alignment process during bonding of the wafers 70. Specifically, two wafers 70A, 70B are formed with alignment marks 84A, 84B that have opposite magnetic polarity. As a result, the first alignment marks 84A are magnetically attracted to the second alignment marks 84B when the wafers 70A, 70B are bonded together. The magnetic attraction between the alignment marks 84A, 84B generates a horizontal force in a horizontal plane (that is parallel to the front sides 70F of the wafers 70A, 70B), and the horizontal force is large enough to move the wafers in the horizontal plane such that the first alignment marks 84A are aligned with the second alignment marks 84B. Magnetic self-alignment between the wafers 70A, 70B may thus be achieved, and utilizing magnetic self-alignment during bonding may reduce misalignment between the bonded wafers 70A, 70B.

In an embodiment, a method includes: forming a first wafer and a second wafer, the first wafer including a first alignment mark, the first alignment mark including a first magnetic cross, the first magnetic cross including a first north pole and a first south pole, the first north pole including first adjacent arms of the first magnetic cross, the first south pole including second adjacent arms of the first magnetic cross, the second wafer including a second alignment mark, the second alignment mark including a second magnetic cross, the second magnetic cross including a second north pole and a second south pole, the second north pole including first adjacent arms of the second magnetic cross, the second south pole including second adjacent arms of the second magnetic cross; aligning the first alignment mark with the second alignment mark in an optical alignment process; after the optical alignment process, aligning the first alignment mark with the second alignment mark in a magnetic alignment process, the first north pole aligned with the second south pole, the first south pole aligned with the second north pole; and forming bonds between the first wafer and the second wafer. In some embodiments of the method, the first alignment mark includes a first grid of first magnetic crosses, the first magnetic cross being one of the first magnetic crosses, where alternating rows of the first magnetic crosses within the first grid are offset. In some embodiments of the method, every other row of the first magnetic crosses is aligned. In some embodiments of the method, the first magnetic cross and the second magnetic cross each include cobalt-iron-nickel doped with boron, silicon, or molybdenum. In some embodiments of the method, the first wafer further includes a first dielectric layer and a first bonding pad, the first alignment mark and the first bonding pad are formed in the first dielectric layer, the second wafer further includes a second dielectric layer and a second bonding pad, the second alignment mark and the second bonding pad are formed in the second dielectric layer, and the first bonding pad, the second bonding pad, the first alignment mark, and the second alignment mark are formed of the same magnetic material. In some embodiments of the method, the first wafer further includes a first dielectric layer and a first bonding pad, the first alignment mark and the first bonding pad are formed in the first dielectric layer, the second wafer further includes a second dielectric layer and a second bonding pad, the second alignment mark and the second bonding pad are formed in the second dielectric layer, the first bonding pad the second bonding pad are formed of a conductive material, the first alignment mark and the second alignment mark are formed of a magnetic material, and the conductive material is different from the magnetic material. In some embodiments of the method, the first wafer further includes a first dielectric layer, the first alignment mark is formed in the first dielectric layer, the second wafer further includes a second dielectric layer, the second alignment mark is formed in the second dielectric layer, and forming bonds between the first wafer and the second wafer includes: forming dielectric-to-dielectric bonds between the first dielectric layer and the second dielectric layer; and forming metal-to-metal bonds between the first alignment mark and the second alignment mark.

In an embodiment, a method includes: applying a first magnetic field to a first wafer to magnetize first alignment marks of the first wafer, the first alignment marks each including first magnetic crosses, the first magnetic field forming a first non-zero angle with first arms of the first magnetic crosses; applying a second magnetic field to a second wafer to magnetize second alignment marks of the second wafer, the second alignment marks each including second magnetic crosses, the second magnetic field forming a second non-zero angle with second arms of the second magnetic crosses, the first magnetic field having opposite polarity from the second magnetic field; moving the first wafer towards the second wafer until the first alignment marks and the second alignment marks exert a horizontal force and vertical force on the first wafer and the second wafer; and forming bonds between the first wafer and the second wafer. In some embodiments of the method, the first magnetic field has a different strength from the second magnetic field. In some embodiments of the method, the first magnetic field has the same strength as the second magnetic field. In some embodiments of the method, each of the first arms has a first width, each of the first arms has a first length, and the first length is greater than the first width. In some embodiments of the method, each of the first arms has a first width, each of the first arms has a first length, and the first length is less than the first width. In some embodiments of the method, the first alignment marks of each of the first magnetic crosses are arranged in a first grid, and the first arms of the first magnetic crosses in adjacent rows of the first grid overlap. In some embodiments of the method, moving the first wafer towards the second wafer begins moving the first alignment marks and the second alignment marks to aligned positions, the method further including: after moving the first wafer towards the second wafer, waiting until the first alignment marks and the second alignment marks finish moving to the aligned positions. In some embodiments of the method, waiting until the first alignment marks and the second alignment marks finish moving to the aligned positions includes waiting for a duration in a range of 10 µs to 5000 µs. In some embodiments of the method, forming the bonds between the first wafer and the second wafer includes: contacting a first dielectric layer of the first wafer to a second dielectric layer of the second wafer; contacting the first alignment marks of the first wafer to the second alignment marks of the second wafer; and annealing the first wafer and the second wafer.

In an embodiment, a structure includes: a first device including a first dielectric layer and a first alignment mark in the first dielectric layer, the first alignment mark including a first magnetic cross, the first magnetic cross having a first north pole and a first south pole; and a second device including a second dielectric layer and a second alignment mark in the second dielectric layer, the second alignment mark including a second magnetic cross, the second magnetic cross having a second north pole and a second south pole, the first north pole aligned with the second south pole, the first south pole aligned with the second north pole, the first dielectric layer bonded to the second dielectric layer by dielectric-to-dielectric bonds, the first alignment mark bonded to the second alignment mark by metal-to-metal bonds. In some embodiments of the structure, the first alignment mark includes a first grid of first magnetic crosses, the first magnetic cross being one of the first magnetic crosses, where alternating rows of the first magnetic crosses within the first grid are offset. In some embodiments of the structure, the first magnetic crosses include first arms, and the first arms of the first magnetic crosses in adjacent rows of the first grid overlap. In some embodiments of the structure, the first north pole includes first adjacent arms of the first magnetic cross, and the first south pole includes second adjacent arms of the first magnetic cross.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a first device comprising a first dielectric layer and a first alignment mark in the first dielectric layer, the first alignment mark comprising a first magnetic cross, the first magnetic cross having a first north pole and a first south pole, the first north pole comprising first adjacent arms of the first magnetic cross, and the first south pole comprising second adjacent arms of the first magnetic cross; and
a second device comprising a second dielectric layer and a second alignment mark in the second dielectric layer, the second alignment mark comprising a second magnetic cross, the second magnetic cross having a second north pole and a second south pole, the first north pole aligned with the second south pole, the first south pole aligned with the second north pole, the first dielectric layer bonded to the second dielectric layer by dielectric-to-dielectric bonds, the first alignment mark bonded to the second alignment mark by metal-to-metal bonds.

2. The structure of claim 1, wherein the first alignment mark comprises a first grid of first magnetic crosses, the first magnetic cross being one of the first magnetic crosses, wherein alternating rows of the first magnetic crosses within the first grid are offset.

3. The structure of claim 2, wherein the first magnetic crosses comprise first arms, and the first arms of the first magnetic crosses in adjacent rows of the first grid overlap.

4. The structure of claim 1, wherein the first device further comprises first bonding pads in the first dielectric layer, the second device further comprises second bonding pads in the second dielectric layer, the first bonding pads are bonded to the second bonding pads by metal-to-metal bonds, and the first bonding pads and the second bonding pads comprise a conductive material that is different from a magnetic material of the first alignment mark and the second alignment mark.

5. The structure of claim 4, wherein the magnetic material has a greater resistivity and greater transparency than the conductive material.

6. The structure of claim 4, wherein the first alignment mark and the second alignment mark have a stronger magnetization than the first bonding pads and the second bonding pads.

7. A structure comprising:
a first device comprising a first dielectric layer, a first bonding pad in the first dielectric layer, and a first alignment mark, the first alignment mark comprising a first magnetic cross; and
a second device comprising a second dielectric layer, a second bonding pad in the second dielectric layer, and a second alignment mark, the second alignment mark comprising a second magnetic cross, the first magnetic cross being aligned with the second magnetic cross, the first bonding pad and the second bonding pad comprising a conductive material, the first alignment mark and the second alignment mark comprising a magnetic material, the magnetic material being different from the conductive material, the magnetic material having greater transparency than the conductive material at infrared light, the first dielectric layer bonded to the second dielectric layer by dielectric-to-dielectric bonds, the first bonding pad bonded to the second bonding pad by metal-to-metal bonds.

8. The structure of claim 7, wherein the infrared light has a wavelength of light in a range of 0.3 μm to 3 μm.

9. The structure of claim 7, wherein the magnetic material has a greater resistivity than the conductive material.

10. The structure of claim 7, wherein the magnetic material is cobalt-iron-nickel doped with boron, silicon, or molybdenum.

11. The structure of claim 7, wherein the first magnetic cross comprises first arms, the second magnetic cross comprises second arms, the first magnetic cross has a magnetization direction that is at a non-zero angle with the first arms of the first magnetic cross, and the second magnetic cross has a magnetization direction that is at a non-zero angle with the second arms of the second magnetic cross.

12. The structure of claim 7, wherein the first magnetic cross comprises four arms that protrude from a central portion, a first pair of adjacent arms of the four arms forms a north pole of the first magnetic cross, and a second pair of adjacent arms of the four arms forms a south pole of the first magnetic cross.

13. The structure of claim 7, wherein the first magnetic cross comprises four arms that protrude from a central portion, each arm having a length along a direction radiating from the central portion and a width along a direction perpendicular to the direction radiating from the central portion, the length being greater than the width.

14. The structure of claim 7, wherein the first magnetic cross comprises four arms that protrude from a central portion, each arm having a length along a direction radiating from the central portion and a width along a direction perpendicular to the direction radiating from the central portion, the length being less than the width.

15. The structure of claim 7, wherein the first device further comprises a semiconductor substrate, an interconnect structure, and conductive vias, wherein the first dielectric layer is over the interconnect structure, the interconnect structure is over the semiconductor substrate, the conductive vias extend into the interconnect structure, and the conductive vias are electrically coupled to metallization patterns of the interconnect structure.

16. The structure of claim 7, wherein the first alignment mark is one of a plurality of alignment marks disposed at edges of the first device.

17. A structure comprising:

a first device comprising a first dielectric layer and a first alignment mark in the first dielectric layer, the first alignment mark comprising a first magnetic cross, the first magnetic cross comprising first arms that protrude from a first central portion, a first pair of adjacent arms of the first arms forming a first north pole of the first magnetic cross, a second pair of adjacent arms of the first arms forming a first south pole of the first magnetic cross, each of the first arms having a first width, each of the first arms having a first length, the first length being different than the first width; and a second device comprising a second dielectric layer and a second alignment mark in the second dielectric layer, the second alignment mark comprising a second magnetic cross, the second magnetic cross comprising second arms that protrude from a second central portion, a first pair of adjacent arms of the second arms forming a second north pole of the second magnetic cross, a second pair of adjacent arms of the second arms forming a second south pole of the second magnetic cross, the first north pole aligned with the second south pole, the first south pole aligned with the second north pole.

18. The structure of claim 17, wherein the first length is greater than the first width.

19. The structure of claim 17, wherein the first length is less than the first width.

20. The structure of claim 17, wherein the first device further comprises a first bonding pad in the first dielectric layer, the second device further comprises a second bonding pad in the second dielectric layer, the first bonding pad and the second bonding pad comprising a conductive material, the first alignment mark and the second alignment mark comprising a magnetic material, the magnetic material having greater transparency than the conductive material at infrared light.

* * * * *